(12) United States Patent
Shimizu et al.

(10) Patent No.: US 7,915,631 B2
(45) Date of Patent: Mar. 29, 2011

(54) LIGHT EMITTING DEVICE AND DISPLAY

(75) Inventors: Yoshinori Shimizu, Tokushima (JP);
Kensho Sakano, Anan (JP); Yasunobu Noguchi, Tokushima (JP); Toshio Moriguchi, Anan (JP)

(73) Assignee: Nichia Corporation, Anan-shi (JP)

( * ) Notice: Subject to any disclaimer, the term of this patent is extended or adjusted under 35 U.S.C. 154(b) by 90 days.

(21) Appl. No.: 12/548,618

(22) Filed: Aug. 27, 2009

(65) Prior Publication Data

US 2010/0006819 A1 Jan. 14, 2010

Related U.S. Application Data

(62) Division of application No. 12/028,062, filed on Feb. 8, 2008, now Pat. No. 7,682,848, which is a division of application No. 10/609,402, filed on Jul. 1, 2003, now Pat. No. 7,362,048, which is a division of application No. 09/458,024, filed on Dec. 10, 1999, now Pat. No. 6,614,179, which is a division of application No. 09/300,315, filed on Apr. 28, 1999, now Pat. No. 6,069,440, which is a division of application No. 08/902,725, filed on Jul. 29, 1997, now Pat. No. 5,998,925.

(30) Foreign Application Priority Data

| Jul. 29, 1996 | (JP) | P 8-198585 |
| Sep. 17, 1996 | (JP) | P 8-244339 |
| Sep. 18, 1996 | (JP) | P 8-245381 |
| Dec. 27, 1996 | (JP) | P 8-359004 |
| Mar. 31, 1997 | (JP) | P 9-081010 |

(51) Int. Cl.
*H01L 29/22* (2006.01)

(52) U.S. Cl. ...... 257/98; 257/99; 257/100; 257/E33.061
(58) Field of Classification Search ............... 257/98, 257/13, 99, 100, 101, E33.061
See application file for complete search history.

(56) References Cited

U.S. PATENT DOCUMENTS 3,510,732 A 5/1970 Amans
(Continued)

FOREIGN PATENT DOCUMENTS

DE 3804293 A1 8/1989
(Continued)

OTHER PUBLICATIONS

Hide et al., "White light from InGaN/conjugated polymer hybrid light-emitting diodes," Appl. Phys. Lett., vol. 70 (20), May 19, 1997, http://apl.aip.org/copyright.jsp, pp. 2664-2666.

(Continued)

*Primary Examiner* — Michael Trinh
(74) *Attorney, Agent, or Firm* — Birch Stewart Kolasch & Birch, LLP

(57) ABSTRACT

A light emitting device containing a semiconductor light emitting component and a phosphor, the phosphor is capable of absorbing a part of light emitted by the light emitting component and emitting light of a wavelength different from that of the absorbed light, is provided. A straight line connecting a point of chromaticity corresponding to a spectrum generated by the light emitting component and a point of chromaticity corresponding to a spectrum generated by the phosphor is substantially along a black body radiation locus in a chromaticity diagram.

14 Claims, 19 Drawing Sheets

U.S. PATENT DOCUMENTS

| | | | |
|---|---|---|---|
| 3,652,956 A | 3/1972 | Pinnow et al. | |
| 3,691,482 A | 9/1972 | Pinnow et al. | |
| 3,699,478 A | 10/1972 | Pinnow et al. | |
| 3,748,548 A | 7/1973 | Haisty et al. | |
| 3,819,974 A | 6/1974 | Stevenson et al. | |
| 3,875,456 A | 4/1975 | Kano et al. | |
| 4,001,628 A | 1/1977 | Ryan | |
| 4,298,820 A | 11/1981 | Bongers et al. | |
| 4,314,910 A | 2/1982 | Barnes | |
| 4,550,256 A | 10/1985 | Berkstesser et al. | |
| 4,644,223 A | 2/1987 | de Hair et al. | |
| 4,716,337 A | 12/1987 | Huiskes et al. | |
| 4,727,283 A | 2/1988 | van Kemenade et al. | |
| 4,857,228 A | 8/1989 | Kabay et al. | |
| 4,905,060 A | 2/1990 | Chinone et al. | |
| 5,006,908 A | 4/1991 | Matsuoka et al. | |
| 5,043,716 A * | 8/1991 | Latz et al. | 345/82 |
| 5,045,867 A | 9/1991 | Fuse | |
| 5,118,985 A | 6/1992 | Patton et al. | |
| 5,202,777 A | 4/1993 | Sluzky et al. | |
| 5,208,462 A | 5/1993 | O'Connor et al. | |
| 5,221,984 A | 6/1993 | Furuyama et al. | |
| 5,257,049 A | 10/1993 | Van Peteghem | |
| 5,369,289 A | 11/1994 | Tamaki et al. | |
| 5,471,113 A | 11/1995 | De Backer et al. | |
| 5,512,210 A | 4/1996 | Sluzky et al. | |
| 5,550,657 A | 8/1996 | Tanaka et al. | |
| 5,578,839 A | 11/1996 | Nakamura et al. | |
| 5,594,751 A | 1/1997 | Scott | |
| 5,602,418 A | 2/1997 | Imai et al. | |
| 5,623,181 A * | 4/1997 | Suehiro et al. | 313/512 |
| 5,630,741 A | 5/1997 | Potter | |
| 5,700,713 A | 12/1997 | Yamazaki et al. | |
| 5,706,022 A | 1/1998 | Hato | |
| 5,743,629 A | 4/1998 | Helstern et al. | |
| 5,798,537 A | 8/1998 | Nitta | |
| 5,801,435 A | 9/1998 | Otsuki | |
| 5,825,125 A | 10/1998 | Ligthart et al. | |
| 5,847,507 A * | 12/1998 | Butterworth et al. | 313/512 |
| 5,949,182 A | 9/1999 | Shealy et al. | |
| 5,959,316 A | 9/1999 | Lowery | |
| 5,998,925 A | 12/1999 | Shimizu et al. | |
| 6,004,001 A | 12/1999 | Noll | |
| 6,015,200 A | 1/2000 | Ogura | |
| 6,066,861 A | 5/2000 | Hohn et al. | |
| 6,069,440 A | 5/2000 | Shimizu et al. | |
| 6,340,824 B1 | 1/2002 | Komoto et al. | |
| 6,538,371 B1 | 3/2003 | Duggal et al. | |
| 6,576,930 B2 | 6/2003 | Reeh et al. | |
| 6,600,175 B1 | 7/2003 | Baretz et al. | |
| 6,608,332 B2 | 8/2003 | Shimizu et al. | |
| 6,614,179 B1 | 9/2003 | Shimizu et al. | |
| 6,784,511 B1 | 8/2004 | Kunihara et al. | |
| 6,812,500 B2 | 11/2004 | Reeh et al. | |
| 7,026,756 B2 | 4/2006 | Shimizu et al. | |
| 7,071,616 B2 | 7/2006 | Shimizu et al. | |
| 7,126,274 B2 | 10/2006 | Shimizu et al. | |
| 7,215,074 B2 | 5/2007 | Shimizu et al. | |
| 7,329,988 B2 | 2/2008 | Shimizu et al. | |
| 7,362,048 B2 | 4/2008 | Shimizu et al. | |
| 7,531,960 B2 | 5/2009 | Shimizu et al. | |
| 2001/0030326 A1 | 10/2001 | Reeh et al. | |
| 2009/0315014 A1 | 12/2009 | Shimizu et al. | |
| 2009/0315015 A1 | 12/2009 | Shimizu et al. | |
| 2010/0001258 A1 | 1/2010 | Shimizu et al. | |

FOREIGN PATENT DOCUMENTS

| | | |
|---|---|---|
| DE | 9013615 U | 1/1991 |
| EP | 0 209 942 A1 | 1/1987 |
| EP | 0 383 215 A | 8/1990 |
| EP | 0 500 937 A1 | 9/1992 |
| EP | 0-550-937 A1 | 9/1992 |
| EP | 0 541 373 A2 | 11/1992 |
| EP | 0 667 383 A2 | 8/1995 |
| GB | 1 305 111 | 1/1973 |
| GB | 2 000 173 | 1/1979 |
| GB | 1589964 | 5/1981 |
| JP | 4717684 | 9/1972 |
| JP | 49106283 | 12/1972 |
| JP | 5079379 | 11/1973 |
| JP | 491221 | 1/1974 |
| JP | 49112577 | 10/1974 |
| JP | 49-122292 | 11/1974 |
| JP | 5043913 C1 | 4/1975 |
| JP | 5245181 | 10/1977 |
| JP | 53-7153 | 1/1978 |
| JP | 5331584 | 3/1978 |
| JP | 5472484 | 11/1978 |
| JP | 5441660 | 12/1979 |
| JP | 55-4898 A | 1/1980 |
| JP | 554898 A | 1/1980 |
| JP | 59-30107 U | 2/1984 |
| JP | 5950445 | 4/1984 |
| JP | 60144381 | 7/1985 |
| JP | 60-185457 | 9/1985 |
| JP | 62189770 | 2/1986 |
| JP | 61-158606 | 7/1986 |
| JP | 62-20237 A | 1/1987 |
| JP | 6220237 A | 1/1987 |
| JP | 62167387 | 7/1987 |
| JP | 62-232827 A | 10/1987 |
| JP | 291980 | 9/1988 |
| JP | 01-189695 A | 7/1989 |
| JP | 01179471 A | 7/1989 |
| JP | 01-257993 A | 10/1989 |
| JP | 01-260707 A | 10/1989 |
| JP | 55-005533 A | 1/1990 |
| JP | 02-111922 A | 4/1990 |
| JP | 324692 | 3/1991 |
| JP | 03-152898 A | 6/1991 |
| JP | 4-80286 A | 3/1992 |
| JP | 463162 | 5/1992 |
| JP | 463163 | 5/1992 |
| JP | 4-234481 A | 8/1992 |
| JP | 5-226676 | 3/1993 |
| JP | 05-142424 A | 6/1993 |
| JP | 05152609 | 6/1993 |
| JP | 5152609 A | 6/1993 |
| JP | 5183189 A | 7/1993 |
| JP | 05-63068 U | 8/1993 |
| JP | 563068 | 8/1993 |
| JP | 06-027327 A | 2/1994 |
| JP | 06-82633 A | 3/1994 |
| JP | 6-115158 | 4/1994 |
| JP | 06-139973 A | 5/1994 |
| JP | 0 599 224 A1 | 6/1994 |
| JP | 06-160635 A | 6/1994 |
| JP | 06-177423 A | 6/1994 |
| JP | 06177423 | 6/1994 |
| JP | 6208845 | 7/1994 |
| JP | 06-231605 A | 8/1994 |
| JP | 06260680 | 9/1994 |
| JP | 06268257 | 9/1994 |
| JP | 6-296043 A | 10/1994 |
| JP | 7-99345 A | 4/1995 |
| JP | 07099345 A | 4/1995 |
| JP | 07-114904 A | 5/1995 |
| JP | 07-120754 A | 5/1995 |
| JP | 7-32638 U | 6/1995 |
| JP | 7-42152 A | 7/1995 |
| JP | 742152 | 7/1995 |
| JP | 07176794 | 7/1995 |
| JP | 07-235207 A | 9/1995 |
| JP | 07-288341 | 10/1995 |
| JP | 7-321407 | 12/1995 |
| JP | 08007614 A | 1/1996 |
| JP | 8-78727 A | 3/1996 |
| JP | 863119 | 3/1996 |
| JP | 8170077 | 7/1996 |
| JP | 09-027642 A | 1/1997 |
| JP | 09027642 A | 1/1997 |
| JP | 10036835 A | 2/1998 |
| JP | 11-500584 | 1/1999 |
| JP | 2000-512806 | 9/2000 |
| JP | 2001-320094 A | 11/2001 |

| JP | 2002-270020 A | 9/2002 |
| WO | WO-97/50132 A1 | 12/1997 |
| WO | WO-98/12757 A1 | 3/1998 |

OTHER PUBLICATIONS

"White LED lamp: Efficient light-emitting; Manufacture cost half", Nikkei Sangyo Shimbun, Sep. 13, 1996, Published by Nihon Keizai Shimbunsha.

"Simens SMT-TOPLED fur die Oberflachenmontage" Frank Mollmer et al. Simens Components, 29 (1991) Hfet 4.

"Proceedings of the Institute of Phosphor Society", Translation of pp. 1, 5 to 14 of the 264th Proceedings of the Institute of Phosphor Society, Nov. 29, 1996.

"Nichia Chemical starts the sample shipment of white light emitting diode", News Report, translation of p. 15 of Nikkei Electronics Sep. 23, 1996 (No. 671).

"GaNpn Contact Blue/Ultraviolet light Emitting Diode", H. Amano et al., Applied Physics, vol. 20, No. 2, pp. 163-166 (1991).

"Phosphors Based on Rare-Earths, A New Era in Fluorescent Lighting", B.M.J. Smets, Materials Chemistry and Physics, 16 pp. 283-299 (1987).

"A New Phosphor for Flying-Spot Cathode-Ray Tubes for Color Television: Yellow Emitting..", G. Blasse et al., App. Phys. Lett. vol. 11, No. 2, pp. 53-55 (1967).

Y. Nayatani, Color Research & Application, vol. 20, No. 3, Jun. 1995, pp. 143-155.

Wustlich MIKRO-/OPTO-ELEKTRONIK GMBH (1994/1995).

W.W. Holloway, Jr. et al., "Optical Properties of Cerium-Activated Garnet Crystals", 1969 Journal of the Optical Society of America, vol. 59, No. 1, pp. 60-63.

W.W. Holloway, Jr. et al., "On The Fluorescence of Cerium—Activated Garnet Crystals", Physics Letters, vol. 25A, No. 8, Oct. 23, 1967, pp. 614-615.

W.J. Miniscalco et al., "Measurements of Excited-State Absorption in Ce3+:YAGa)", J. Appl. Phys. vol. 49, No. 12, Dec. 1978, pp. 6109-6111.

Takashi Matsuoka et al., "Growth and Properties of a Wide-Gap Semiconductor InGaN", Optoelectronics-Devices and Technologies, vol. 5, No. 1, pp. 53-64, Jun. 1990.

Tadao Miura, Electronics Engineering, "High-intensity White Backlighting for LCD of Car Audios", Jul. 1996, vol. 38, No. 7, pp. 55-58.

T. Nagatomo et al., "Ga1-xlnxN Blue Light-Emitting Diodes", Proc. Electrochem. Soc., 1993, vol. 93-10, pp. 136-141.

Shuji Nakamura, "Zn-doped InGaN growth and InGaN/AlGaN double-heterostructure blue-light-emitting diodes", Journal of Crystal Growth, 145 (1994), pp. 911-917.

Shuji Nakamura, "InGaN/AlGaN blue-light-emitting diodes", J. Vac. Sci. Technol. A 13(3), May/Jun. 1995, pp. 705-710.

Shuji Nakamura, "High-Power InGaN/AlGaN Double-Heterostructure Blue-Light-Emitting Diodes", IEDM 94 (1994), IEEE, pp. 567-570.

Shuji Nakamura et al., "Si-Doped InGaN Films Grown on GaN Films", Jpn. J. Appl. Phys. vol. 32 (1993), pp. L16-L19, Part 2, No. 1A/B, Jan. 15, 1993.

Shuji Nakamura et al., "P-GaN/N-InGaN/N-GaN Double-Heterostructure Blue-Light-Emitting Diodes", Jpn. J. Appl. Phys. vol. 32 (1993), pp. L8-L11, Part 2, No. 1A/B, Jan. 15, 1993.

Shigeo Shionoya et al. (editors), "Phosphor Handbook", pp. 505-508, CRC Press, 1999.

Sato et al., Japanese Journal of Applied Physics, vol. 35, Jul. 1, 1996, pp. L838-L839.

S. Nakaura et al., Japanese Journal of Applied Physics Part 2, vol. 31, No. 10B, 1992, pp. L1457-1459.

R. W. G. Hunt, Color Research & Application, vol. 16, No. 3, 1991, pp. 146-165.

Proceedings of Illumination National Convention in 1983, p. 12.

Phosphor Handbook, 1st Edition, 1987, pp. 233-240 and 275-277.

P. Schlouer et al. "Luminescence Conversion of Blue Light Emitting Diodes", Applied Physics Letter, vol. 46, p. 417-418, Feb. 1997.

Nikkei Sangyo Shin-bun of Sep. 13, 1996.

Nakamura, SPIE, vol. 3002, pp. 26-35 (1997).

Mitsubishi Electric Company Technical Report, vol. 48, No. 9, 1974, pp. 1121-1124.

M.F. Yan et al., Preparation of Y3AI5O12-Based Phosphor Powders, J. Electrochem. Soc., vol. 134, No. 2, Feb. 1987.

M. Ikeda, Journal of the Illumination Society, vol. 71, No. 10, 1987, pp. 612-617 and English Abstract.

M. Ikeda et al., Color Research & Application, vol. 16, No. 2, Apr. 1991, pp. 72-80.

M. Ikeda et al., Color Research & Application, vol. 14, No. 4, Aug. 1989, pp. 198-206.

Kozo Osamura et al., "Preparation and optical properties of Ga1-xlnxN thin films", Journal of Applied Physics, vol. 46, No. 8, Aug. 1975, pp. 3432-3437.

Journal of the Television Society, vol. 47, No. 5, 1993, pp. 753-764.

J.M. Robertson, et al., "Colourshift of the Ce3+ Emission in Monocrystalline Epitaxially Grown Garnet Layers", 1981 Philips J. Res. 36, pp. 15-30.

Hoffman, Journal of les, pp. 89-91 (1977).

H. Shinoda et al., Color Research & Application, vol. 18, No. 5, Oct. 1993, pp. 326-333.

G. Blasse et al., "Investigation of Some Ce3+-Activated Phosphors", Journal of Chemical Physics, vol. 47, No. 12, Dec. 15, 1967.

E.F. Gibbons et al., "Some Factors Influencing the Luminous Decay Characteristics of Y3AI5O12:Ce3+", J. Electrochem. Soc., vol. 120, No. 6, Jun. 1973.

D.J. Robbins et al., "Lattice Defects and Energy Transfer Phenomena in Y3AI5O12:Ce3+", pp. 1004-1013, printed Jun. 19, 2001.

Branko et al., Development and applications of highbright white LED lamps, Nov. 29, 1996, The 264th Proceedings of the Institute of Phosphor Society, pp. 4-16 of the English translation.

Nakamura et al., "High-Brightness InGaN Blue, Green and Yellow Light-Emitting Diodes with Quantum Well Structures", Japanese Journal of Applied Physics, vol. 34, No. 7A, Part 2, Jul. 1, 1995, pp. L797-L799 XP000702022.

Non-Final Office Action issued Aug. 2, 2010, in co-pending U.S. Appl. No. 12/559,042.

Notice of Allowance and Examiner's Comments on Allowance issued Jan. 28, 1999, in U.S. Appl. No. 08/902,725 (U.S. Patent 5,998,925).

Office Action issued Nov. 17, 2000, in U.S. Appl. No. 08/902,725 (U.S. Patent 5,998,925).

Notice of Allowance and Examiner's Comments on Allowance issued Oct. 8, 1999, in U.S. Appl. No. 09/300,315 (U.S. Patent 6,069,440).

Office Action issued Mar. 13, 2001, in U.S. Appl. No. 09/458,024 (U.S. Patent 6,614,179).

Notice of Allowance and Examiner's Comments on Allowance issued Mar. 26, 2003, in U.S. Appl. No. 09/458,024 (U.S. Patent 6,614,179).

Office Action issued Aug. 14, 2002, in U.S. Appl. No. 09/736,425 (U.S. Patent 6,608,332).

Notice of Allowance and Examiner's Comments on Allowance issued Mar. 25, 2003, in U.S. Appl. No. 09/736,425 (U.S. Patent 6,608,332).

Office Action issued Aug. 19, 2005, in U.S. Appl. No. 10/609,402 (U.S. Patent 7,362,048).

Office Action issued Jul. 27, 2007, in U.S. Appl. No. 10/609,402 (U.S. Patent 7,362,048).

Office Action issued Jan. 2, 2008, in U.S. Appl. No. 10/609,402 (U.S. Patent 7,362,048).

Notice of Allowance and Examiner's Comments on Allowance issued Feb. 13, 2008, in U.S. Appl. No. 10/609,402 (U.S. Patent 7,362,048).

Notice of Allowance and Examiner's Comments on Allowance issued May 4, 2005, in U.S. Appl. No. 10/609,503 (U.S. Patent 7,071,616).

Office Action issued Apr. 8, 2005, in U.S. Appl. No. 10/677,382 (U.S. Patent 7,026,756).

Notice of Allowance and Examiner's Comments on Allowance issued Sep. 22, 2005, in U.S. Appl. No. 10/677,382 (U.S. Patent 7,026,756).
Office Action issued Feb. 28, 2006, in U.S. Appl. No. 10/677,382 (U.S. Patent 7,026,756).
Notice of Allowance and Examiner's Comments on Allowance issued Feb. 11, 2009, in U.S. Appl. No. 11/682,014 (U.S. Patent 7,531,960).
Office Action issued Sep. 7, 2005, in U.S. Appl. No. 10/864,544 (U.S. Patent 7,126,274).
Notice of Allowance and Examiner's Comments on Allowance issued Mar. 10, 2006, in U.S. Appl. No. 10/864,544 (U.S. Patent 7,126,274).
Office Action issued Dec. 13, 2005, in U.S. Appl. No. 11/208,729 (U.S. Patent 7,215,074).
Notice of Allowance and Examiner's Comments on Allowance issued Sep. 7, 2006, in U.S. Appl. No. 11/208,729 (U.S. Patent 7,215,074).
Office Action issued Apr. 4, 2007, in U.S. Appl. No. 11/653,275 (U.S. Patent 7,329,988).
Notice of Allowance and Examiner's Comments on Allowance issued Sep. 25, 2007, in U.S. Appl. No. 11/653,275 (U.S. Patent 7,329,988).
Office Action dated Jul. 7, 2010 for U.S. Appl. No. 12/548,614.
Office Action dated Jun. 16, 2010 for U.S. Appl. No. 12/548,621.
Office Action dated Nov. 10, 2010 for U.S. Appl. No. 12/575,162.
Office Action dated Nov. 15, 2010 for U.S. Appl. No. 12/548,614.

* cited by examiner

Excitation spectrum

Emission spectrum

Excitation spectrum

Emission spectrum

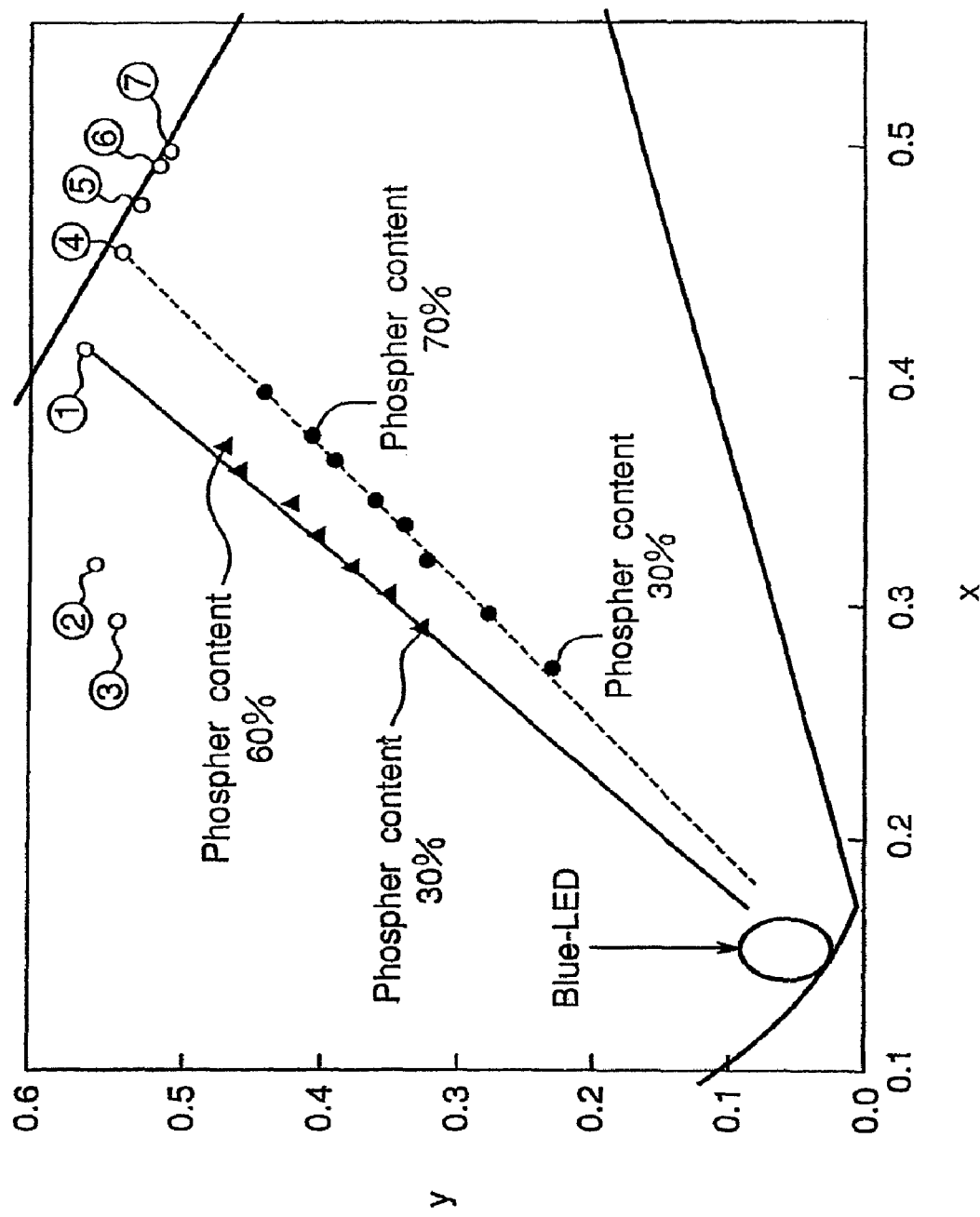

LIGHT EMITTING DEVICE AND DISPLAY

CROSS-REFERENCE TO RELATED APPLICATIONS

This application is a divisional of U.S. application Ser. No. 12/028,062 filed Feb. 8, 2008 now U.S. Pat. No. 7,682,848, which is a divisional of U.S. application Ser. No. 10/609,402 filed Jul. 1, 2003, now U.S. Pat. No. 7,362,048, which is a divisional of U.S. application Ser. No. 09/458,024, filed Dec. 10, 1999, now U.S. Pat. No. 6,614,179, which is a divisional of U.S. application Ser. No. 09/300,315, filed on Apr. 28, 1999, now U.S. Pat. No. 6,069,440, which is a divisional of U.S. application Ser. No. 08/902,725, filed on Jul. 29, 1997, now U.S. Pat. No. 5,998,925, which also claims priority on Japanese Patent Application Nos. P 08-198585 filed Jul. 29, 1996; P 08-244339 filed Sep. 17, 1996; P 08-245381 filed Sep. 18, 1996; P 08-359004 filed Dec. 27, 1996; and P 09-081010 filed Mar. 31, 1997. The entire contents of each of these applications is hereby incorporated by reference.

BACKGROUND OF THE INVENTION

1. Field of the Invention

The present invention relates to a light emitting diode used in LED display, back light source, traffic signal, trailway signal, illuminating switch, indicator, etc. More particularly, it relates to a light emitting device (LED) comprising a phosphor, which converts the wavelength of light emitted by a light emitting component and emits light, and a display device using the light emitting device.

2. Description of Related Art

A light emitting diode is compact and emits light of clear color with high efficiency. It is also free from such a trouble as bum-out and has good initial drive characteristic, high vibration resistance and durability to endure repetitive ON/OFF operations, because it is a semiconductor element. Thus it has been used widely in such applications as various indicators and various light sources. Recently light emitting diodes for RGB (red, green and blue) colors having ultra-high luminance and high efficiency have been developed, and large screen LED displays using these light emitting diodes have been put into use. The LED display can be operated with less power and has such good characteristics as light weight and long life, and is therefore expected to be more widely used in the future.

Recently, various attempts have been made to make white light sources by using light emitting diodes. Because the light emitting diode has a favorable emission spectrum to generate monochromatic light, making a light source for white light requires it to arrange three light emitting components of R, G and B closely to each other while diffusing and mixing the light emitted by them. When generating white light with such an arrangement, there has been such a problem that white light of the desired tone cannot be generated due to variations in the tone, luminance and other factors of the light emitting component. Also when the light emitting components are made of different materials, electric power required for driving differs from one light emitting diode to another, making it necessary to apply different voltages different light emitting components, which leads to complex drive circuit. Moreover, because the light emitting components are semiconductor light emitting components, color tone is subject to variation due to the difference in temperature characteristics, chronological changes and operating environment, or unevenness in color may be caused due to failure in uniformly mixing the light emitted by the light emitting components. Thus light emitting diodes are effective as light emitting devices for generating individual colors, although a satisfactory light source capable of emitting white light by using light emitting components has not been obtained so far.

In order to solve these problems, the present applicant previously developed light emitting diodes which convert the color of light, which is emitted by light emitting components, by means of a fluorescent material disclosed in Japanese Patent Kokai Nos. 5-152609, 7-99345, 7-176794 and 8-7614. The light emitting diodes disclosed in these publications are such that, by using light emitting components of one kind, are capable of generating light of white and other colors, and are constituted as follows.

The light emitting diode disclosed in the above gazettes are made by mounting a light emitting component, having a large energy band gap of light emitting layer, in a cup provided at the tip of a lead frame, and having a fluorescent material that absorbs light emitted by the light emitting component and emits light of a wavelength different from that of the absorbed light (wavelength conversion), contained in a resin mold which covers the light emitting component.

The light emitting diode disclosed as described above capable of emitting white light by mixing the light of a plurality of sources can be made by using a light emitting component capable of emitting blue light and molding the light emitting component with a resin including a fluorescent material that absorbs the light emitted by the blue light emitting diode and emits yellowish light.

However, conventional light emitting diodes have such problems as deterioration of the fluorescent material leading to color tone deviation and darkening of the fluorescent material resulting in lowered efficiency of extracting light. Darkening here refers to, in the case of using an inorganic fluorescent material such as (Cd, Zn)S fluorescent material, for example, part of metal elements constituting the fluorescent material precipitate or change their properties leading to coloration, or, in the case of using an organic fluorescent material, coloration due to breakage of double bond in the molecule. Especially when a light emitting component made of a semiconductor having a high energy band gap is used to improve the conversion efficiency of the fluorescent material (that is, energy of light emitted by the semiconductor is increased and number of photons having energies above a threshold which can be absorbed by the fluorescent material increases, resulting in more light being absorbed), or the quantity of fluorescent material consumption is decreased (that is, the fluorescent material is irradiated with relatively higher energy), light energy absorbed by the fluorescent material inevitably increases resulting in more significant degradation of the fluorescent material. Use of the light emitting component with higher intensity of light emission for an extended period of time causes further more significant degradation of the fluorescent material.

Also the fluorescent material provided in the vicinity of the light emitting component may be exposed to a high temperature such as rising temperature of the light emitting component and heat transmitted from the external environment (for example, sunlight in case the device is used outdoors).

Further, some fluorescent materials are subject to accelerated deterioration due to combination of moisture entered from the outside or introduced during the production process, the light and heat transmitted from the light emitting component.

When it comes to an organic dye of ionic property, direct current electric field in the vicinity of the chip may cause electrophoresis, resulting in a change in the color tone.

SUMMARY OF THE INVENTION

Thus, an object of the present invention is to solve the problems described above and provide a light emitting device which experiences only extremely low degrees of deterioration in emission light intensity, light emission efficiency and color shift over a long time of use with high luminance.

The present applicant completed the present invention through researches based on the assumption that a light emitting device having a light emitting component and a fluorescent material must meet the following requirements to achieve the above-mentioned object.

The light emitting component must be capable of emitting light of high luminance with light emitting characteristic which is stable over a long time of use.

The fluorescent material being provided in the vicinity of the high-luminance light emitting component, must show excellent resistance against light and heat so that the properties thereof do not change even when used over an extended period of time while being exposed to light of high intensity emitted by the light emitting component (particularly the fluorescent material provided in the vicinity of the light emitting component is exposed to light of a radiation intensity as high as about 30 to 40 times that of sunlight according to our estimate, and is required to have more durability against light as light emitting component of higher luminance is used).

With regard to the relationship with the light emitting component, the fluorescent material must be capable of absorbing with high efficiency the light of high monochromaticity emitted by the light emitting component and emitting light of a wavelength different from that of the light emitted by the light emitting component.

Thus the present invention provides a light emitting device, comprising a light emitting component and a phosphor capable of absorbing a part of light emitted by the light emitting component and emitting light of wavelength different from that of the absorbed light;

wherein said light emitting component comprises a nitride compound semiconductor represented by the formula: $In_iGa_jAl_kN$ where $0 \leq i$, $0 \leq j$, $0 \leq k$ and $i+j+k=1$) and said phosphor contains a garnet fluorescent material comprising at least one element selected from the group consisting of Y, Lu, Sc, La, Gd and Sm, and at least one element selected from the group consisting of Al, Ga and In, and being activated with cerium.

The nitride compound semiconductor (generally represented by chemical formula $In_iGa_jAl_kN$ where $0 \leq i$, $0 \leq j$, $0 \leq k$ and $i+j+k=1$) mentioned above contains various materials including InGaN and GaN doped with various impurities.

The phosphor mentioned above contains various materials defined as described above, including $Y_3Al_5O_{12}$:Ce and $Gd_3In_5O_{12}$:Ce.

Because the light emitting device of the present invention uses the light emitting component made of a nitride compound semiconductor capable of emitting light with high luminance, the light emitting device is capable of emitting light with high luminance. Also the phosphor used in the light emitting device has excellent resistance against light so that the fluorescent properties thereof experience less change even when used over an extended period of time while being exposed to light of high intensity. This makes it possible to reduce the degradation of characteristics during long period of use and reduce deterioration due to light of high intensity emitted by the light emitting component as well as extraneous light (sunlight including ultraviolet light, etc.) during outdoor use, thereby to provide a light emitting device which experiences extremely less color shift and less luminance decrease.

The light emitting device of the present invention can also be used in such applications that require response speeds as high as 120 nsec., for example, because the phosphor used therein allows after glow only for a short period of time.

The phosphor used in the light emitting diode of the present invention preferably contains an yttrium-aluminum-garnet fluorescent material that contains Y and Al, which enables it to increase the luminance of the light emitting device.

In the light emitting device of the present invention, the phosphor may be a fluorescent material represented by a general formula $(Re_{1-r}Sm_r)_3(Al_{1-s}Ga_s)_5O_{12}$:Ce, where $0 \leq r < 1$ and $0 \leq s \leq 1$ and Re is at least one selected from Y and Gd, in which case good characteristics can be obtained similarly to the case where the yttrium-aluminum-garnet fluorescent material is used.

Also in the light emitting device of the present invention, it is preferable, for the purpose of reducing the temperature dependence of light emission characteristics (wavelength of emitted light, intensity of light emission, etc.), to use a fluorescent material represented by a general formula $(Y_{1-p-q-r}Gd_pCe_qSm_r)_3(Al_{1-s}Ga_s)_5O_{12}$ as the phosphor, where $0 \leq p \leq 0.8$, $0.003 \leq q \leq 0.2$, $0.0003 \leq r \leq 0.08$ and $0 \leq s \leq 1$.

Also in the light emitting device of the present invention, the phosphor may contain two or more yttrium-aluminum-garnet fluorescent materials, activated with cerium, of different compositions including Y and Al. With this configuration, light of desired color can be emitted by controlling the emission spectrum of the phosphor according to the property (wavelength of emitted light) of the light emitting component. Further in the light emitting device of the present invention, in order to have light of a specified wavelength emitted by the light emitting device, it is preferable that the phosphor contains two or more fluorescent materials of different compositions represented by general formula $(Re_{1-r}Sm_r)_3(Al_{1-s}Ga_s)_sO_{12}$:Ce, where $0 \leq r \leq 1$ and $0 \leq s \leq 1$ and Re is at least one selected from Y and Gd.

Also in the light emitting device of the present invention, in order to control the wavelength of emitted light, the phosphor may contain a first fluorescent material represented by general formula $Y_3(Al_{1-s}Ga_s)_5O_{12}$:Ce and a second fluorescent material represented by general formula $Re_3Al_5O_{12}$:Ce, where $O \leq s \leq 1$ and Re is at least one selected from Y, Gd and La.

Also in the light emitting device of the present invention, in order to control the wavelength of emitted light, the phosphor may be an yttrium-aluminum-garnet fluorescent material containing a first fluorescent material and a second fluorescent material, with different parts of each yttrium being substituted with gadolinium.

Further in the light emitting device of the present invention, it is preferable that main emission peak of the light emitting component is set within the range from 400 nm to 530 nm and main emission wavelength of the phosphor is set to be longer than the main emission peak of the light emitting component. This makes it possible to efficiently emit white light.

Further in the light emitting device of the present invention, it is preferable that the light emitting layer of the light emitting component contains a gallium nitride semiconductor which contains In, and the phosphor is an yttrium-aluminum-garnet fluorescent material wherein a part of Al in the yttrium-aluminum-garnet fluorescent is substituted by Ga so that the proportion of Ga:Al is within the range from 1:1 to 4:6 and a part of Y in the yttrium-aluminum-garnet fluorescent is substituted by Gd so that the proportion of Y:Gd is within the range from 4:1 to 2:3. Absorption spectrum of the phosphor which is controlled as described above shows good agreement with that of light emitted by the light emitting component which contains gallium nitride semiconductor including In as the light emitting layer, and is capable of improving the conversion efficiency (light emission efficiency). Also the light, generated by mixing blue light emitted by the light emitting component and fluorescent light of the fluorescent material, is a white light of good color rendering and, in this regard, an excellent light emitting device can be provided.

The light emitting device according to one embodiment of the present invention comprises a substantially rectangular optical guide plate provided with the light emitting component mounted on one side face thereof via the phosphor and surfaces of which except for one principal surface are substantially covered with a reflective material, wherein a light emitted by the light emitting component is turned into a planar light by the phosphor and the optical guide plate and to be an output from the principal surface of the optical guide plate.

The light emitting device according to another embodiment of the present invention has a substantially rectangular optical guide plate, which is provided with the light emitting component mounted on one side face thereof and the phosphor installed on one principal surface with surfaces thereof and except for the principal surface being substantially covered with a reflective material, wherein a light emitted by the light emitting component is turned into a planar light by the optical guide plate and the phosphor, to be an output from the principal surface of the optical guide plate.

The LED display device according to the present invention has an LED display device comprising the light emitting devices of the present invention arranged in a matrix and a drive circuit which drives the LED display device according to display data which is input thereto. This configuration makes it possible to provide a relatively low-priced LED display device which is capable of high-definition display with less color unevenness due to the viewing angle.

The light emitting diode according to one embodiment of the present invention comprises:

a mount lead having a cup and a lead;

an LED chip mounted in the cup of the mount lead with one of electrodes being electrically connected to the mount lead;

a transparent coating material filling the cup to cover the LED chip; and a light emitting diode having a molding material which covers the LED chip covered with the coating material including the cup of the mount lead, the inner lead and another electrode of the LED chip, wherein the LED chip is a nitride compound semiconductor and the coating material contains at least one element selected from the group consisting of Y, Lu, Sc, La, Gd and Sm, at least one element selected from the group consisting of Al, Ga and In and a phosphor made of garnet fluorescent material activated with cerium.

The phosphor used in the light emitting diode of the present invention preferably contains an yttrium-aluminum-garnet fluorescent material that contains Y and Al.

In the light emitting diode of the present invention, the phosphor may be a fluorescent material represented by a general formula $(Re_{1-r}Sm_r)_3(Al_{1-s}Ga_s)_5O_{12}:Ce$, where $0 \leq r < 1$ and $0 \leq s \leq 1$ and Re is at least one selected from Y and Gd.

Also in the light emitting diode of the present invention, a fluorescent material represented by a general formula $(Y_{1-p-q-r}Gd_pCe_qSm_r)_3(Al_{1-s}Ga_s)_5O_{12}$ may be used may be used as the phosphor, where $0 \leq p \leq 0.8$, $0.003 \leq q \leq 0.2$, $0.0003 \leq r \leq 0.08$ and $0 \leq s \leq 1$.

In the light emitting diode of the present invention, the phosphor preferably contain two or more yttrium-aluminum-garnet fluorescent materials, activated with cerium, of different compositions including Y and Al, in order to control the emitted light to a desired wavelength.

In the light emitting diode of the present invention, similarly, two or more fluorescent materials of different compositions represented by a general formula $(Re_{1-r}Sm_r)_3(Al_{1-s}Ga_s)_5O_{12}:Ce$, where $0 \leq r < 1$ and $0 \leq s \leq 1$ and Re is at least one selected from Y and Gd may be used as the phosphor in order to control the emitted light to a desired wavelength.

In the light emitting diode of the present invention, similarly, a first fluorescent material represented by a general formula $Y_3(Al_{1-s}Ga_s)_5O_{12}:Ce$ and a second fluorescent material represented by a general formula $Re_3Al_5O_{12}:Ce$, may be used as the phosphor where $0 \leq s \leq 1$ and Re is at least one selected from Y, Gd and La, in order to control the emitted light to a desired wavelength.

In the light emitting diode of the present invention, similarly, yttrium-aluminum-garnet fluorescent material a first fluorescent material and a second fluorescent material may be used wherein a part of yttrium in the first and second fluorescent materials is substituted with gadolinium to different degrees of substitution as the phosphor, in order to control the emitted light to a desired wavelength.

Generally, a fluorescent material which absorbs light of a short wavelength and emits light of a long wavelength has higher efficiency than a fluorescent material which absorbs light of a long wavelength and emits light of a short wavelength. It is preferable to use a light emitting component which emits visible light than a light emitting component which emits ultraviolet light that degrades resin (molding material, coating material, etc.). Thus for the light emitting diode of the present invention, for the purpose of improving the light emitting efficiency and ensure long life, it is preferable that main emission peak of the light emitting component be set within a relatively short wavelength range of 400 nm to 530 nm in the visible light region, and main emission wavelength of the phosphor be set to be longer than the main emission peak of the light emitting component. With this arrangement, because light converted by the fluorescent material has longer wavelength than that of light emitted by the light emitting component, it will not be absorbed by the light emitting component even when the light emitting component is irradiated with light which has been reflected and converted by the fluorescent material (since the energy of the converted light is less than the band gap energy). Thus the light which has been reflected by the fluorescent material or the like is reflected by the cup wherein the light emitting component is mounted, making higher efficiency of emission possible.

BRIEF DESCRIPTION OF THE DRAWINGS

FIG. 17 is a chromaticity diagram showing the change in color tone when the concentration of fluorescent material is changed in the light emitting diode which combines the fluorescent materials shown in Table 1 and blue LED having peak wavelength at 465 nm.

DETAILED DESCRIPTION OF THE PREFERRED EMBODIMENTS

Now referring to the attached drawings, preferred embodiments of the present invention will be described below.

Figure 1:
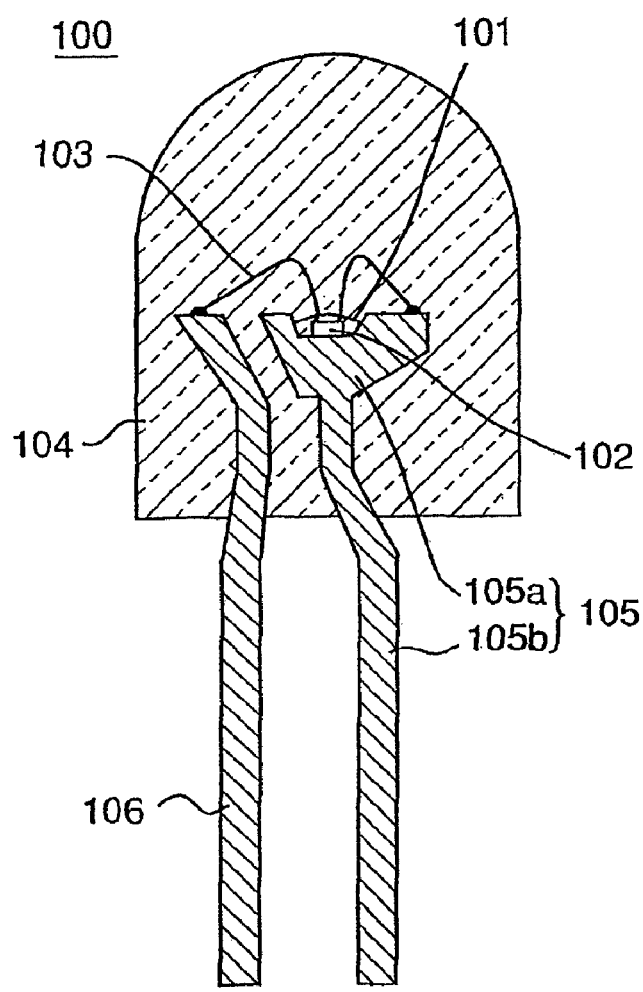
FIG. 1 is a schematic sectional view of a lead type light emitting diode according to the embodiment of the present invention.

A light emitting diode 100 of FIG. 1 is a lead type light emitting diode having a mount lead 105 and an inner lead 106, wherein a light emitting component 102 is installed on a cup 105a of the mount lead 105, and the cup 105a is filled with a coating resin 101 which contains a specified phosphor to cover the light emitting component 102 and is molded in resin. An n electrode and a p electrode of the light emitting component 102 are connected to the mount lead 105 and the inner lead 106, respectively, by means of wires 103.

In the light emitting diode constituted as described above, part of light emitted by the light emitting component (LED chip) 102 (hereinafter referred to as LED light) excites the phosphor contained in the coating resin 101 to generate fluorescent light having a wavelength different from that of LED light, so that the fluorescent light emitted by the phosphor and LED light which is output without contributing to the excitation of the phosphor are mixed and output. As a result, the light emitting diode 100 also outputs light having a wavelength different from that of LED light emitted by the light emitting component 102.

Figure 2:
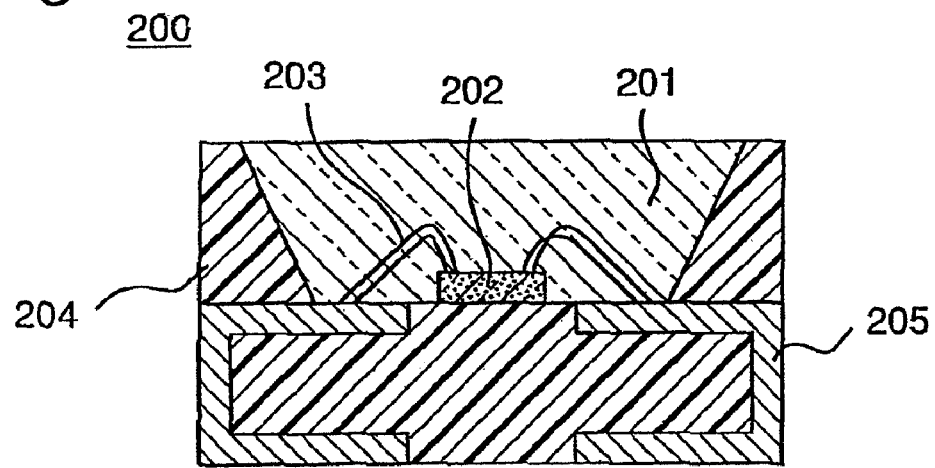
FIG. 2 is a schematic sectional view of a tip type light emitting diode according to the embodiment of the present invention.

FIG. 2 shows a chip type light emitting diode, wherein light emitting diode (LED chip) 202 is installed in a recess of a casing 204 which is filled with a coating material which contains a specified phosphor to form a coating 201. The light emitting component 202 is fixed by using an epoxy resin or the like which contains Ag, for example, and an n electrode and a p electrode of the light emitting component 202 are connected to metal terminals 205 installed on the casing 204 by means of conductive wires 203. In the chip type light emitting diode constituted as described above, similarly to the lead type light emitting diode of FIG. 1, fluorescent light emitted by the phosphor and LED light which is transmitted without being absorbed by the phosphor are mixed and output, so that the light emitting diode 200 also outputs light having a wavelength different from that of LED light emitted by the light emitting component 202.

The light emitting diode containing the phosphor as described above has the following features.

Light emitted by a light emitting component (LED) is usually emitted through an electrode which supplies electric power to the light emitting component. Emitted light is partly blocked by the electrode formed on the light emitting component resulting in a particular emission pattern, and is therefore not emitted uniformly in every direction. The light emitting diode which contains the fluorescent material, however, can emit light uniformly over a wide range without forming undesirable emission pattern because the light is emitted after being diffused by the fluorescent material.

Although light emitted by the light emitting component (LED) has a monochromatic peak, the peak is broad and has high color rendering property. This characteristic makes an indispensable advantage for an application which requires wavelengths of a relatively wide range. Light source for an optical image scanner, for example, is desirable to have a wider emission peak.

The light emitting diodes of the first and second embodiments to be described below have the configuration shown in FIG. 1 or FIG. 2 wherein a light emitting component which uses nitride compound semiconductor having relatively high energy in the visible region and a particular phosphor are combined, and have such favorable properties as capability to emit light of high luminance and less degradation of light emission efficiency and less color shift over an extended period of use.

In general, a fluorescent material which absorbs light of a short wavelength and emits light of a long wavelength has higher efficiency than a fluorescent material which absorbs light of a long wavelength and emits light of a short wavelength, and therefore it is preferable to use a nitride compound semiconductor light emitting component which is capable of emitting blue light of short wavelength. It needs not to say that the use of a light emitting component having high luminance is preferable.

A phosphor to be used in combination with the nitride compound semiconductor light emitting component must have the following requirements:

Excellent resistance against light to endure light of a high intensity for a long period of time, because the fluorescent material is installed in the vicinity of the light emitting components 102, 202 and is exposed to light of intensity as high as about 30 to 40 times that of sun light.

Capability to efficiently emit light in blue region for the excitation by means of the light emitting components 102, 202. When mixing of colors is used, should be capable of emitting blue light, not ultraviolet ray, with a high efficiency.

capability to emit light from green to red regions for the purpose of mixing with blue light to generate white light.

Good temperature characteristic suitable for location in the vicinity of the light emitting components 102, 202 and the resultant influence of temperature difference due to heat generated by the chip when lighting, Capability to continuously change the color tone in terms of the proportion of composition or ratio of mixing a plurality of fluorescent materials.

Weatherability for the operating environment of the light emitting diode.

Embodiment 1

The light emitting diode of the first embodiment of the present invention employs a gallium nitride compound semiconductor element which has high-energy band gap in the light emitting layer and is capable of emitting blue light, and a garnet phosphor activated with cerium in combination. With this configuration, the light emitting diode of the first embodiment can emit white light by blending blue light emitted by the light emitting components 102, 202 and yellow light emitted by the phosphor excited by the blue light.

Because the garnet phosphor activated with cerium which is used in the light emitting diode of the first embodiment has light resistance and weatherability, it can emit light with extremely small degrees of color shift and decrease in the luminance of emitted light even when irradiated by very intense light emitted by the light emitting components 102, 202 located in the vicinity over a long period of time.

Components of the light emitting diode of the first embodiment will be described in detail below.

(Phosphor)

The phosphor used in the light emitting diode of the first embodiment is a phosphor which, when excited by visible light or ultraviolet ray emitted by the semiconductor light emitting layer, emits light of a wavelength different from that of the exciting light. The phosphor is specifically garnet fluorescent material activated with cerium which contains at least one element selected from Y, Lu, Sc, La, Gd and Sm and at least one element selected from Al, Ga and In. According to the present invention, the fluorescent material is preferably yttrium-aluminum-garnet fluorescent material (YAG phosphor) activated with cerium, or a fluorescent material represented by general formula $(Re_{1-r}Sm_r)3(Al_{1-s}Ga_s)_5O_{12}:Ce$, where $0 \leq r < 1$ and $0 \leq s \leq 1$, and Re is at least one selected from Y and Gd. In case the LED light emitted by the light emitting component employing the gallium nitride compound semiconductor and the fluorescent light emitted by the phosphor having yellow body color are in the relation of complementary colors, white color can be output by blending the LED light and the fluorescent light.

In the first embodiment, because the phosphor is used by blending with a resin which makes the coating resin 101 and the coating material 201 (detailed later), color tone of the light emitting diode can be adjusted including white and incandescent lamp color by controlling the mixing proportion with the resin or the quantity used in filling the cup 105 or the recess of the casing 204 in accordance to the wavelength of light emitted by the gallium nitride light emitting component.

Distribution of the phosphor concentration has influence also on the color blending and durability. That is, when the concentration of phosphor increases from the surface of the coating or molding where the phosphor is contained toward the light emitting component, it becomes less likely to be affected by extraneous moisture thereby making it easier to suppress the deterioration due to moisture. On the other hand, when the concentration of phosphor increases from the light emitting component toward the surface of the molding, it becomes more likely to be affected by extraneous moisture, but less likely to be affected by the heat and radiation from the light emitting component, thus making it possible to suppress the deterioration of the phosphor. Such distributions of the phosphor concentration can be achieved by selecting or controlling the material which contains the phosphor, forming temperature and viscosity, and the configuration and particle size distribution of the phosphor.

By using the phosphor of the first embodiment, light emitting diode having excellent emission characteristics can be made, because the fluorescent material has enough light resistance for high-efficient operation even when arranged adjacent to or in the vicinity of the light emitting components 102, 202 with radiation intensity (Ee) within the range from 3 Wcm-2 to 10 Wcm-2.

Figure 3A:
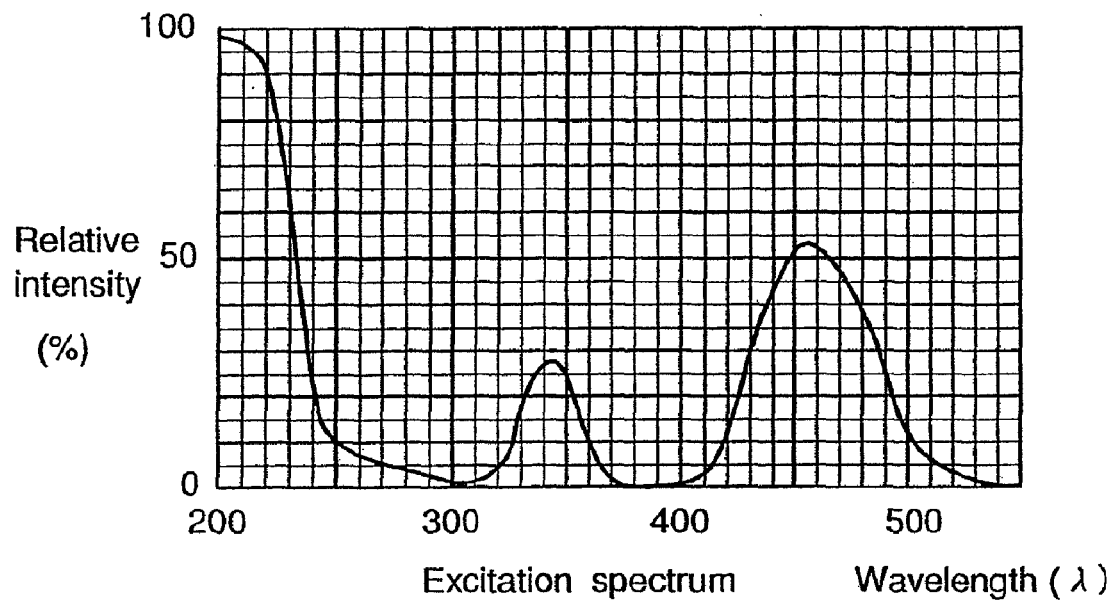
FIG. 3A is a graph showing the excitation spectrum of the garnet fluorescent material activated by cerium used in the first embodiment of the present invention.
Figure 3B:
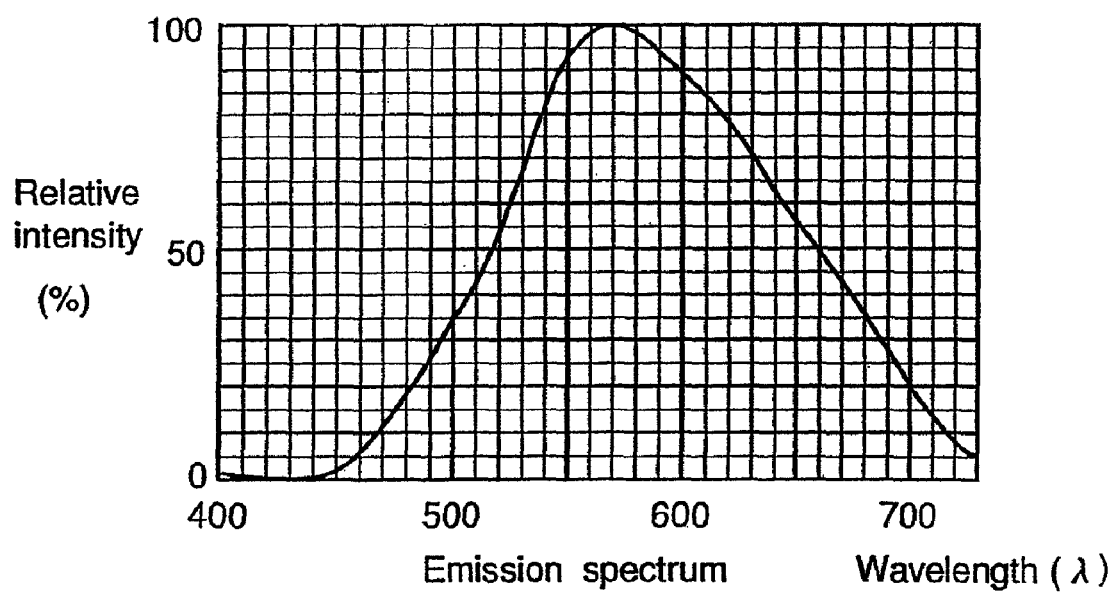
FIG. 3B is a graph showing the emission spectrum of the garnet fluorescent material activated by cerium used in the first embodiment of the present invention.

The phosphor used in the first embodiment is, because of garnet structure, resistant to heat, light and moisture, and is therefore capable of absorbing excitation light having a peak at a wavelength near 450 nm as shown in FIG. 3A. It also emits light of broad spectrum having a peak near 580 nm tailing out to 700 nm as shown in FIG. 3B. Moreover, efficiency of excited light emission in a region of wavelengths 460 nm and higher can be increased by including Gd in the crystal of the phosphor of the first embodiment. When the Gd content is increased, emission peak wavelength is shifted toward longer wavelength and the entire emission spectrum is shifted toward longer wavelengths. This means that, when emission of more reddish light is required, it can be achieved by increasing the degree of substitution with Gd. When the Gd content is increased, luminance of light emitted by photoluminescence under blue light tends to decrease.

Especially when part of Al is substituted with Ga among the composition of YAG fluorescent material having garnet structure, wavelength of emitted light shifts toward shorter wavelength and, when part of Y is substituted with Gd, wavelength of emitted light shifts toward longer wavelength.

Table 1 shows the composition and light emitting characteristics of YAG fluorescent material represented by general formula (Y1-aGda)3(Al1-bGab)5O12:Ce.

TABLE 1

| Gd content a (molar ratio) | Ga content b (molar ratio) | CIE chromaticity coordinates | | Luminance Y | Efficiency |
|---|---|---|---|---|---|
| | | X | y | | |
| 0.0 | 0.0 | 0.41 | 0.56 | 100 | 100 |
| 0.0 | 0.4 | 0.32 | 0.56 | 61 | 63 |
| 0.0 | 0.5 | 0.29 | 0.54 | 55 | 67 |
| 0.2 | 0.0 | 0.45 | 0.53 | 102 | 108 |
| 0.4 | 0.0 | 0.47 | 0.52 | 102 | 113 |
| 0.6 | 0.0 | 0.49 | 0.51 | 97 | 113 |
| 0.8 | 0.0 | 0.50 | 0.50 | 72 | 86 |

Values shown in Table 1 were measured by exciting the fluorescent material with blue light of 460 nm. Luminance and efficiency in Table 1 are given in values relative to those of material No. 1 which are set to 100.

When substituting Al with Ga, the proportion is preferably within the range from Ga:Al=1:1 to 4:6 in consideration of the emission efficiency and emission wavelength. Similarly, when substituting Y with Gd, the proportion is preferably within the range from Y:Gd=9:1 to 1:9, and more preferably from 4:1 to 2:3. It is because a degree of substitution with Gd below 20% results in a color of greater green component and less red component, and a degree of substitution with Gd above 60% results in increased red component but rapid decrease in luminance. When the ratio Y:Gd of Y and Gd in the YAG fluorescent material is set within the range from 4:1 to 2:3, in particular, a light emitting diode capable of emitting white light substantially along the black body radiation locus can be made by using one kind of yttrium-aluminum-garnet fluorescent material, depending on the emission wavelength of the light emitting component. When the ratio Y:Gd of Y and Gd in the YAG fluorescent material is set within the range from 2:3 to 1:4, a light emitting diode capable of emitting light of incandescent lamp can be made though the luminance is low. When the content (degree of substitution) of Ce is set within the range from 0.003 to 0.2, the relative luminous intensity of light emitting diode of not less than 70% can be achieved. When the content is less than 0.003, luminous intensity decreases because the number of excited emission centers of photoluminescence due to Ce decreases and, when the content is greater than 0.2, density quenching occurs.

Thus the wavelength of the emitted light can be shifted to a shorter wavelength by substituting part of Al of the composition with Ga, and the wavelength of the emitted light can be shifted to a longer wavelength by substituting part of Y of the composition with Gd. In this way, the light color of emission can be changed continuously by changing the composition. Also the fluorescent material is hardly excited by Hg emission lines which have such wavelengths as 254 nm and 365 nm, but is excited with higher efficiency by LED light emitted by a blue light emitting component having a wavelength around 450 nm. Thus the fluorescent material has ideal characteristics for converting blue light of nitride semiconductor light emitting component into white light, such as the capability of continuously changing the peak wavelength by changing the proportion of Gd.

According to the first embodiment, the efficiency of light emission of the light emitting diode can be further improved by combining the light emitting component employing gallium nitride semiconductor and the phosphor made by adding rare earth element samarium (Sm) to yttrium-aluminum-garnet fluorescent materials (YAG) activated with cerium.

Material for making such a phosphor is made by using oxides of Y, Gd, Ce, Sm, Al and Ga or compounds which can be easily converted into these oxides at high temperature, and sufficiently mixing these materials in stoichiometrical proportions. This mixture is mixed with an appropriate quantity of a fluoride such as ammonium fluoride used as a flux, and fired in a crucible at a temperature from 1350 to 1450° C. in air for 2 to 5 hours. Then the fired material is ground by a ball mill in water, washed, separated, dried and sieved thereby to obtain the desired material.

In the producing process described above, the mixture material may also be made by dissolving rare earth elements Y, Gd, Ce and Sm in stoichiometrical proportions in an acid, coprecipitating the solution with oxalic acid and firing the coprecipitate to obtain an oxide of the coprecipitate, and then mixing it with aluminum oxide and gallium oxide.

The phosphor represented by the general formula (Y1-p-q-rGdpCeqSmr)3Al5O12 can emit light of wavelengths 460 nm and longer with higher efficiency upon excitation, because Gd is contained in the crystal. When the content of gadolinium is increased, peak wavelength of emission shifts from 530 nm to a longer wavelength up to 570 nm, while the entire emission spectrum also shifts to longer wavelengths. When light of stronger red shade is needed, it can be achieved by increasing the amount of Gd added for substitution. When the content of Gd is increased, luminance of photoluminescence with blue light gradually decreases. Therefore, value of p is preferably 0.8 or lower, or more preferably 0.7 or lower. Further more preferably it is 0.6 or lower.

The phosphor represented by the general formula (Y1-p-q-rGdpCeqSmr)3Al5O12 including Sm can be made subject to less dependence on temperature regardless of the increased content of Gd. That is, the phosphor, when Sm is contained, has greatly improved emission luminance at higher temperatures. Extent of the improvement increases as the Gd content is increased. Temperature characteristic can be greatly improved particularly by the addition of Sm in the case of fluorescent material of such a composition as red shade is strengthened by increasing the content of Gd, because it has poor temperature characteristics. The temperature characteristic mentioned here is measured in terms of the ratio (%) of emission luminance of the fluorescent material at a high temperature (200° C.) relative to the emission luminance of exciting blue light having a wavelength of 450 nm at the normal temperature (25° C.).

The proportion of Sm is preferably within the range of $0.0003 \leq r \leq 0.08$ to give temperature characteristic of 60% or higher. The value of r below this range leads to less effect of improving the temperature characteristic. When the value of r is above this range, on the contrary, the temperature characteristic deteriorates. The range of $0.0007 \leq r \leq 0.02$ for the proportion of Sm where temperature characteristic becomes 80% or higher is more desirable.

The proportion q of Ce is preferably in a range of $0.003 \leq q \leq 0.2$, which makes relative emission luminance of 70% or higher possible. The relative emission luminance refers to the emission luminance in terms of percentage to the emission luminance of a fluorescent material where q=0.03.

When the proportion q of Ce is 0.003 or lower, luminance decreases because the number of excited emission centers of photoluminescence due to Ce decreases and, when the q is greater than 0.2, density quenching occurs. Density quenching refers to the decrease in emission intensity which occurs when the concentration of an activation agent added to increase the luminance of the fluorescent material is increased beyond an optimum level.

For the light emitting diode of the present invention, a mixture of two or more kinds of phosphors having compositions of $(Y1-p-q-rGdpCeqSmr)3Al5O12$ having different contents of Al, Ga, Y and Gs or Sm may also be used. This increases the RGB components and enables the application, for example, for a full-color liquid crystal display device by using a color filter.

(Light Emitting Components 102, 202)

The light emitting component is preferably embedded in a molding material as shown in FIG. 1 and FIG. 2. The light emitting component used in the light emitting diode of the present invention is a gallium nitride compound semiconductor capable of efficiently exciting the garnet fluorescent materials activated with cerium. The light emitting components 102, 202 employing gallium nitride compound semiconductor are made by forming a light emitting layer of gallium nitride semiconductor such as InGaN on a substrate in the MOCVD process. The structure of the light emitting component may be homostructure, heterostructure or double-heterostructure which have MIS junction, PIN junction or PN junction. Various wavelengths of emission can be selected depending on the material of the semiconductor layer and the crystallinity thereof. It may also be made in a single quantum well structure or multiple quantum well structure where a semiconductor activation layer is formed as thin as quantum effect can occur. According to the present invention, a light emitting diode capable of emitting with higher luminance without deterioration of the phosphor can be made by making the activation layer of the light emitting component in single quantum well structure of InGaN.

When a gallium nitride compound semiconductor is used, while sapphire, spinnel, SiC, Si, ZnO or the like may be used as the semiconductor substrate, use of sapphire substrate is preferable in order to form gallium nitride of good crystallinity. A gallium nitride semiconductor layer is formed on the sapphire substrate to form a PN junction via a buffer layer of GaN, AlN, etc. The gallium nitride semiconductor has N type conductivity under the condition of not doped with any impurity, although in order to form an N type gallium nitride semiconductor having desired properties (carrier concentration, etc.) such as improved light emission efficiency, it is preferably doped with N type dopant such as Si, Ge, Se, Te, and C. In order to form a P type gallium nitride semiconductor, on the other hand, it is preferably doped with P type dopant such as Zn, Mg, Be, Ca, Sr and Ba. Because it is difficult to turn a gallium nitride compound semiconductor to P type simply by doping a P type dopant, it is preferable to treat the gallium nitride compound semiconductor doped with P type dopant in such process as heating in a furnace, irradiation with low-speed electron beam and plasma irradiation, thereby to turn it to P type. After exposing the surfaces of P type and N type gallium nitride semiconductors by the etching or other process, electrodes of the desired shapes are formed on the semiconductor layers by sputtering or vapor deposition.

Then the semiconductor wafer which has been formed is cut into pieces by means of a dicing saw, or separated by an external force after cutting grooves (half-cut) which have width greater than the blade edge width. Or otherwise, the wafer is cut into chips by scribing grid pattern of extremely fine lines on the semiconductor wafer by means of a scriber having a diamond stylus which makes straight reciprocal movement. Thus the light emitting component of gallium nitride compound semiconductor can be made.

Figure 4:
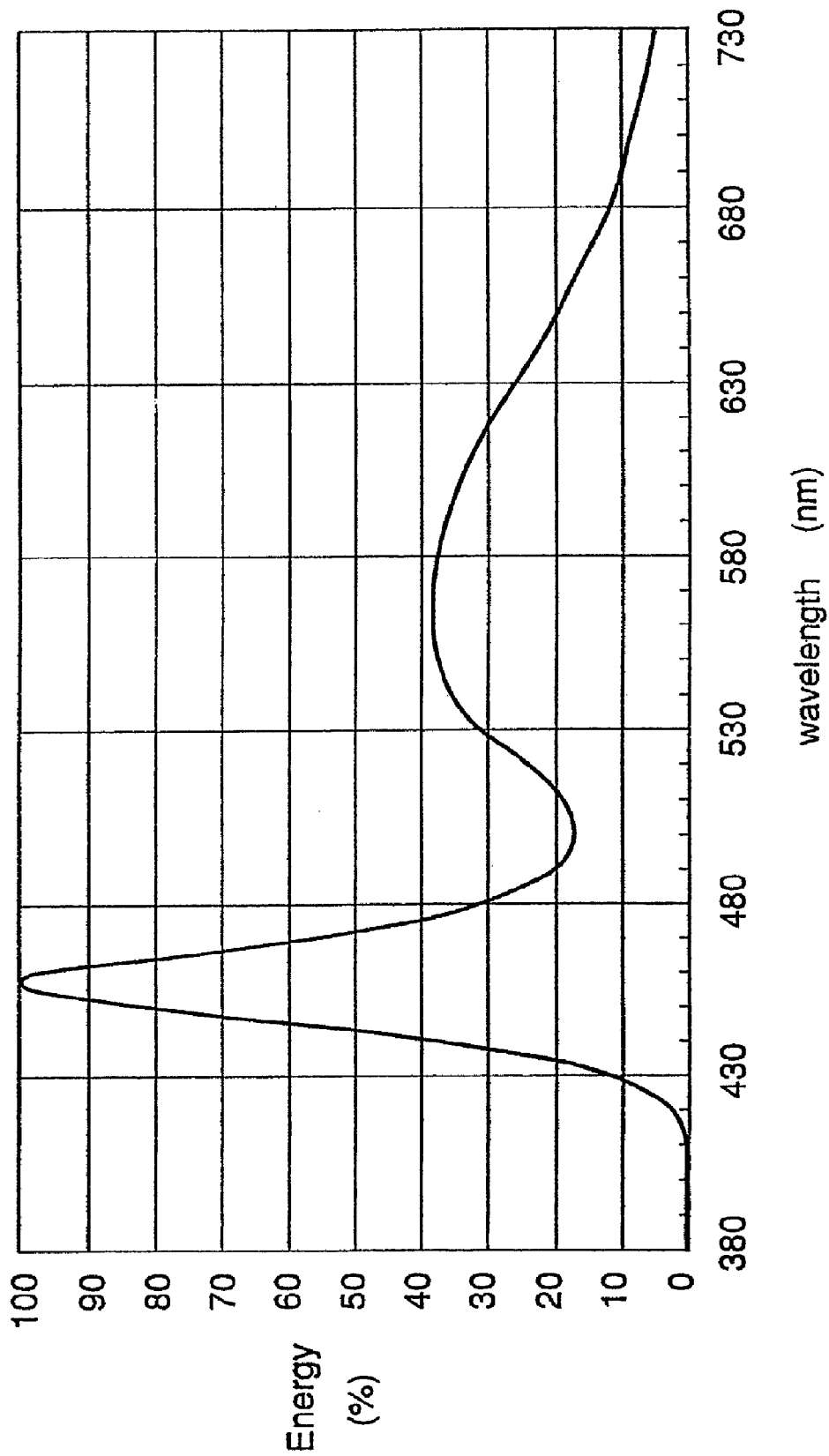
FIG. 4 is a graph showing the emission spectrum of the light emitting diode of the first embodiment of the present invention.

In order to emit white light with the light emitting diode of the first embodiment, wavelength of light emitted by the light emitting component is preferably from 400 nm to 530 nm inclusive in consideration of the complementary color relationship with the phosphor and deterioration of resin, and more preferably from 420 nm to 490 nm inclusive. It is further more preferable that the wavelength be from 450 nm to 475 nm, in order to improve the emission efficiency of the light emitting component and the phosphor. Emission spectrum of the white light emitting diode of the first embodiment is shown in FIG. 4. The light emitting component shown here is of lead type shown in FIG. 1, which employs the light emitting component and the phosphor of the first embodiment to be described later. In FIG. 4, emission having a peak around 450 nm is the light emitted by the light emitting component, and emission having a peak around 570 nm is the photoluminescent emission excited by the light emitting component.

Figure 16:
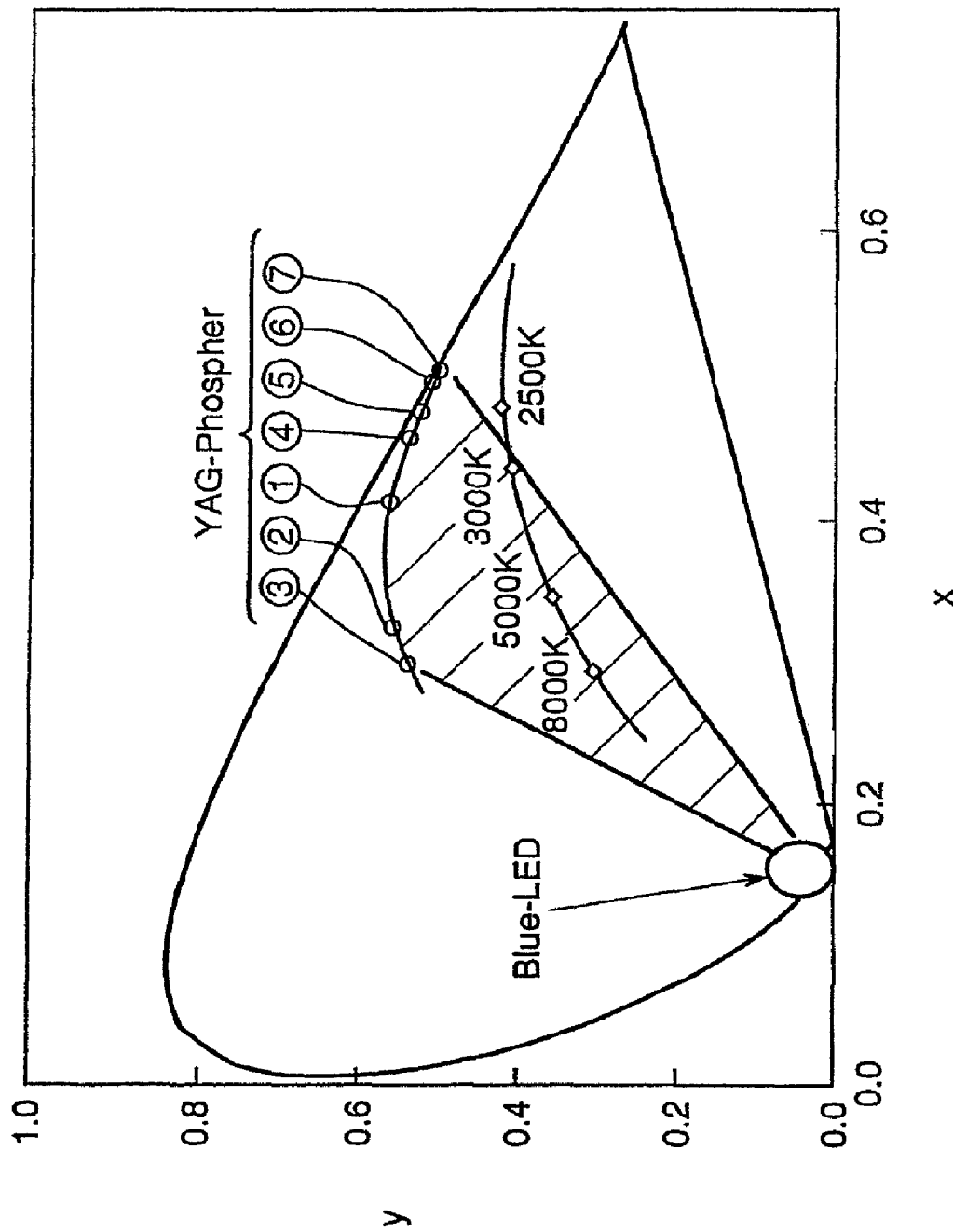
FIG. 16 is a chromaticity diagram showing the range of color tone which can be obtained with a light emitting diode which combines the fluorescent materials shown in Table 1 and blue LED having peak wavelength at 465 nm.

FIG. 16 shows the colors which can be represented by the white light emitting diode made by combining the fluorescent material shown in Table 1 and blue LED (light emitting component) having peak wavelength 465 nm. Color of light emitted by this white light emitting diode corresponds to a point on a straight line connecting a point of chromaticity generated by the blue LED and a point of chromaticity generated by the fluorescent material, and therefore the wide white color region (shaded portion in FIG. 16) in the central portion of the chromaticity diagram can be fully covered by using the fluorescent materials 1 to 7 in Table 1. FIG. 17 shows the change in emission color when the contents of fluorescent materials in the white light emitting diode is changed. Contents of fluorescent materials are given in weight percentage to the resin used in the coating material. As will be seen from FIG. 17, color of the light approaches that of the fluorescent materials when the content of fluorescent material is increased and approaches that of blue LED when the content of fluorescent material decreased.

According to the present invention, a light emitting component which does not excite the fluorescent material may be used together with the light emitting component which emits light that excites the fluorescent material. Specifically, in addition to the fluorescent material which is a nitride compound semiconductor capable of exciting the fluorescent material, a light emitting component having a light emitting layer made of gallium phosphate, gallium aluminum arsenide, gallium arsenic phosphate or indium aluminum phosphate is arranged together. With this configuration, light emitted by the light emitting component which does not excite the fluorescent material is radiated to the outside without being absorbed by the fluorescent material, making a light emitting diode which can emit red/white light.

Other components of the light emitting diodes of FIG. 1 and FIG. 2 will be described below.

(Conductive Wires 103, 203)

The conductive wires 103, 203 should have good electric conductivity, good thermal conductivity and good mechanical connection with the electrodes of the light emitting components 102, 202. Thermal conductivity is preferably 0.01 cal/(s)(cm2)(° C./cm) or higher, and more preferably 0.5 cal/(s)(cm2)(° C./cm) or higher. For workability, diameter of the conductive wire is preferably from 10 μm to 45 μm inclusive. Even when the same material is used for both the coating including the fluorescent material and the molding, because of the difference in thermal expansion coefficient due to the fluorescent material contained in either of the above two materials, the conductive wire is likely to break at the interface. For this reason, diameter of the conductive wire is preferably not less than 25 μm and, for the reason of light emitting area and ease of handling, preferably within 35 μm. The conductive wire may be a metal such as gold, copper, platinum and aluminum or an alloy thereof. When a conductive wire of such material and configuration is used, it can be easily connected to the electrodes of the light emitting components, the inner lead and the mount lead by means of a wire bonding device.

(Mount Lead 105)

The mount lead 105 comprises a cup 105a and a lead 105b, and it suffices to have a size enough for mounting the light emitting component 102 with the wire bonding device in the cup 105a. In case a plurality of light emitting components are installed in the cup and the mount lead is used as common electrode for the light emitting component, because different electrode materials may be used, sufficient electrical conductivity and good conductivity with the bonding wire and others are required. When the light emitting component is installed in the cup of the mount lead and the cup is filled with the fluorescent material, light emitted by the fluorescent material is, even if isotropic, reflected by the cup in a desired direction and therefore erroneous illumination due to light from other light emitting diode mounted nearby can be prevented. Erroneous illumination here refers to such a phenomenon as other light emitting diode mounted nearby appearing as though lighting despite not being supplied with power.

Bonding of the light emitting component 102 and the mount lead 105 with the cup 105a can be achieved by means of a thermoplastic resin such as epoxy resin, acrylic resin and imide resin. When a face-down light emitting component (such a type of light emitting component as emitted light is extracted from the substrate side and is configured for mounting the electrodes to oppose the cup 105a) is used, Ag paste, carbon paste, metallic bump or the like can be used for bonding and electrically connecting the light emitting component and the mount lead at the same time. Further, in order to improve the efficiency of light utilization of the light emitting diode, surface of the cup of the mount lead whereon the light emitting component is mounted may be mirror-polished to give reflecting function to the surface. In this case, the surface roughness is preferably from 0.1 S to 0.8 S inclusive. Electric resistance of the mount lead is preferably within 300 μΩ-cm and more preferably within 3 μΩ-cm. When mounting a plurality of light emitting components on the mount lead, the light emitting components generate significant amount of heat and therefore high thermal conductivity is required. Specifically, the thermal conductivity is preferably 0.01 cal/(s)(cm2)(° C./cm) or higher, and more preferably 0.5 cal/(s)(cm2)(° C./cm) or higher. Materials which satisfy these requirements contain steel, copper, copper-clad steel, copper-clad tin and metallized ceramics.

(Inner Lead 106)

The inner lead 106 is connected to one of electrodes of the light emitting component 102 mounted on the mount lead 105 by means of conductive wire or the like. In the case of a light emitting diode where a plurality of the light emitting components are installed on the mount lead, it is necessary to arrange a plurality of inner leads 106 in such a manner that the conductive wires do not touch each other. For example, contact of the conductive wires with each other can be prevented by increasing the area of the end face where the inner lead is wire-bonded as the distance from the mount lead increases so that the space between the conductive wires is secured. Surface roughness of the inner lead end face connecting with the conductive wire is preferably from 1.6 S to 10 S inclusive in consideration of close contact. In order to form the inner lead in a desired shape, it may be punched by means of a die. Further, it may be made by punching to form the inner lead then pressurizing it on the end face thereby to control the area and height of the end face.

The inner lead is required to have good connectivity with the bonding wires which are conductive wires and have good electrical conductivity. Specifically, the electric resistance is preferably within 300 μΩ•cm and more preferably within 3 μΩ•cm. Materials which satisfy these requirements contain iron, copper, iron-containing copper, tin-containing copper, copper-, gold- or silver-plated aluminum, iron and copper.

(Coating Material 101)

The coating material 101 is provided in the cup of the mount lead apart from the molding material 104 and, in the first embodiment, contains the phosphor which converts the light emitted by the light emitting component. The coating material may be a transparent material having good weatherability such as epoxy resin, urea resin and silicone or glass. A dispersant may be used together with the phosphor. As the dispersant, barium titanate, titanium oxide, aluminum oxide, silicon dioxide and the like are preferably used. When the fluorescent material is formed by sputtering, coating material may be omitted. In this case, a light emitting diode capable of bending colors can be made by controlling the film thickness or providing an aperture in the fluorescent material layer.

(Molding Material 104)

The molding 104 has the function to protect the light emitting component 102, the conductive wire 103 and the coating material 101 which contains phosphor from external disturbance. According to the first embodiment, it is preferable that the molding material 104 further contain a dispersant, which can unsharpen the directivity of light from the light emitting component 102, resulting in increased angle of view. The molding material 104 has the function of lens to focus or diffuse the light emitted by the light emitting component. Therefore, the molding material 104 may be made in a configuration of convex lens or concave lens, and may have an elliptic shape when viewed in the direction of optical axis, or a combination of these. Also the molding material 104 may be made in a structure of multiple layers of different materials being laminated. As the molding material 104, transparent materials having high weatherability such as epoxy resin, urea resin, silicon resin or glass is preferably employed. As the dispersant, barium titanate, titanium oxide, aluminum oxide, silicon dioxide and the like can be used. In addition to the dispersant, phosphor may also be contained in the molding material. Namely, according to the present invention, the phosphor may be contained either in the molding material or in the coating material. When the phosphor is contained in the molding material, angle of view can be further increased. The phosphor may also be contained in both the coating material and the molding material. Further, a resin including the phosphor may be used as the coating material while using glass, different from the coating material, as the molding material. This makes it possible to manufacture a light emitting diode which is less subject to the influence of moisture with good productivity. The molding and the coating may also be made of the same material in order to match the refractive index, depending on the application. According to the present invention, adding the dispersant and/or a coloration agent in the molding material has the effects of masking the color of the fluorescent material obscured and improving the color mixing performance. That is, the fluorescent material absorbs blue component of extraneous light and emits light thereby to give such an appearance as though colored in yellow. However, the dispersant contained in the molding material gives milky white color to the molding material and the coloration agent renders a desired color. Thus the color of the fluorescent material will not be recognized by the observer. In case the light emitting component emits light having main wavelength of 430 nm or over, it is more preferable that ultraviolet absorber which serves as light stabilizer be contained.

Embodiment 2

The light emitting diode of the second embodiment of the present invention is made by using an element provided with gallium nitride compound semiconductor which has high-energy band gap in the light emitting layer as the light emitting component and a fluorescent material including two or more kinds of phosphors of different compositions, or preferably yttrium-aluminum-garnet fluorescent materials activated with cerium as the phosphor. With this configuration, a light emitting diode which allows to give a desired color tone by controlling the contents of the two or more fluorescent materials can be made even when the wavelength of the LED light emitted by the light emitting component deviates from the desired value due to variations in the production process. In this case, emission color of the light emitting diode can be made constantly using a fluorescent material having a relatively short emission wavelength for a light emitting component of a relatively short emission wavelength and using a fluorescent material having a relatively long emission wavelength for a light emitting component of a relatively long emission wavelength.

As for the fluorescent material, a fluorescent material represented by general formula (Re1-rSmr)3(Al1-sGas)5O12:Ce may also be used as the phosphor. Here $0 \leq r < 1$ and $0 \leq s \leq 1$, and Re is at least one selected from Y, Gd and La. This configuration makes it possible to minimize the denaturing of the fluorescent material even when the fluorescent material is exposed to high-intensity high-energy visible light emitted by the light emitting component for a long period of time or when used under various environmental conditions, and therefore a light emitting diode which is subject to extremely insignificant color shift and emission luminance decrease and has the desired emission component of high luminance can be made.

(Phosphor of the Second Embodiment)

Now the phosphor used in the light emitting component of the second embodiment will be described in detail below. The second embodiment is similar to the first embodiment, except that two or more kinds of phosphors of different compositions activated with cerium are used as the phosphor, as described above, and the method of using the fluorescent material is basically the same.

Similarly to the case of the first embodiment, the light emitting diode can be given high weatherability by controlling the distribution of the phosphor (such as tapering the concentration with the distance from the light emitting component). Such a distribution of the phosphor concentration can be achieved by selecting or controlling the material which contains the phosphor, forming temperature and viscosity, and the configuration and particle size distribution of the phosphor. Thus, according to the second embodiment, distribution of the fluorescent material concentration is determined according to the operating conditions. Also, according to the second embodiment, efficiency of light emission can be increased by designing the arrangement of the two or more kinds of fluorescent materials (for example, arranging in the order of nearness to the light emitting component) according to the light generated by the light emitting component.

With the configuration of the second embodiment, similarly to the first embodiment, light emitting diode has high efficiency and enough light resistance even when arranged adjacent to or in the vicinity of relatively high-output light emitting component with radiation intensity (Ee) within the range from 3 Wcm-2 to 10 Wcm-2 can be made.

Figure 5A:
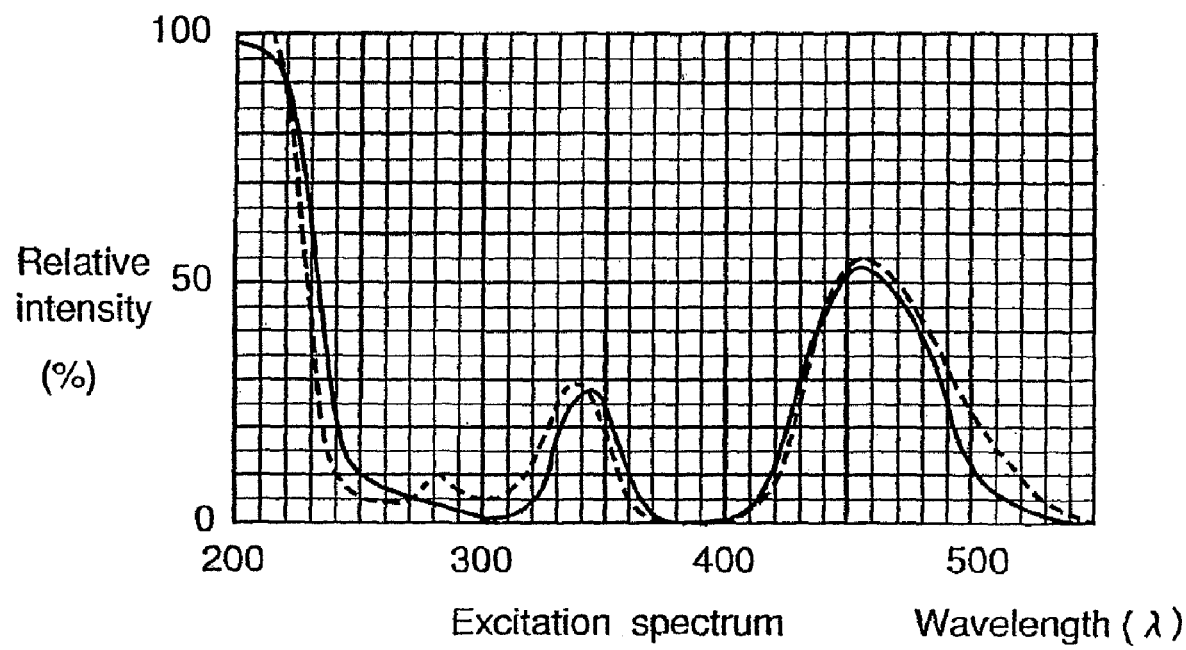
FIG. 5A is a graph showing the excitation spectrum of the yttrium-aluminum-garnet fluorescent material activated by cerium used in the second embodiment of the present invention.
Figure 5B:
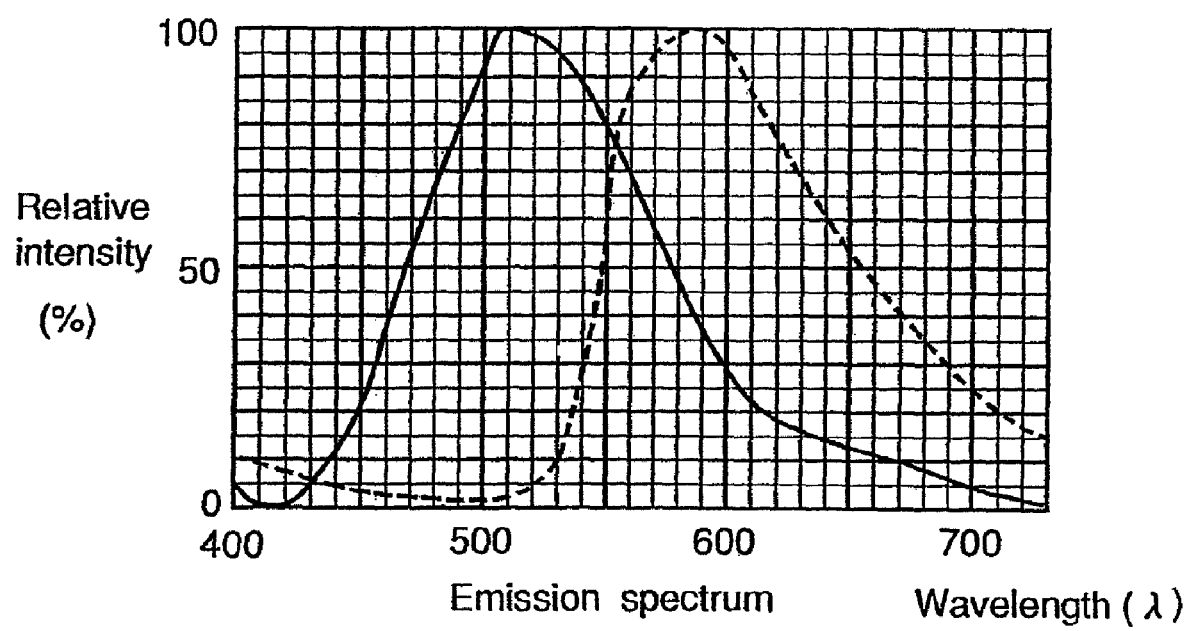
FIG. 5B is a graph showing the emission spectrum of the yttrium-aluminum-garnet fluorescent material activated by cerium used in the second embodiment of the present invention.

The yttrium-aluminum-garnet fluorescent material activated with cerium (YAG fluorescent material) used in the second embodiment has garnet structure similarly to the case of the first embodiment, and is therefore resistant to heat, light and moisture. The peak wavelength of excitation of the yttrium-aluminum-garnet fluorescent material of the second embodiment can be set near 450 nm as indicated by the solid line in FIG. 5A, and the peak wavelength of emission can be set near 510 nm as indicated by the solid line in FIG. 5B, while making the emission spectrum so broad as to tail out to 700 nm. This makes it possible to emit green light. The peak wavelength of excitation of another yttrium-aluminum-garnet fluorescent material activated with cerium of the second embodiment can be set near 450 nm as indicated by the dashed line in FIG. 5A, and the peak wavelength of emission can be set near 600 nm as indicated by the dashed line in FIG. 5B, while making the emission spectrum so broad as to tail out to 750 nm. This makes it possible to emit red light.

Wavelength of the emitted light is shifted to a shorter wavelength by substituting part of Al, among the constituents of the YAG fluorescent material having garnet structure, with Ga, and the wavelength of the emitted light is shifted to a longer wavelength by substituting part of Y with Gd and/or La. Proportion of substituting Al with Ga is preferably from Ga:Al=1:1 to 4:6 in consideration of the light emitting efficiency and the wavelength of emission. Similarly, proportion of substituting Y with Gd and/or La is preferably from Y:Gd and/or La=9:1 to 1:9, or more preferably from Y:Gd and/or La=4:1 to 2:3. Substitution of less than 20% results in an increase of green component and a decrease of red component. Substitution of 80% or greater part, on the other hand, increases red component but decreases the luminance steeply.

Material for making such a phosphor is made by using oxides of Y, Gd, Ce, La, Al, Sm and Ga or compounds which can be easily converted into these oxides at high temperature, and sufficiently mixing these materials in stoichiometrical proportions. Or either, mixture material is obtained by dissolving rare earth elements Y, Gd, Ce, La and Sm in stoichiometrical proportions in acid, coprecipitating the solution oxalic acid and firing the coprecipitate to obtain an oxide of the coprecipitate, which is then mixed with aluminum oxide and gallium oxide. This mixture is mixed with an appropriate quantity of a fluoride such as ammonium fluoride used as a flux, and fired in a crucible at a temperature from 1350 to 1450° C. in air for 2 to 5 hours. Then the fired material is ground by a ball mill in water, washed, separated, dried and sieved thereby to obtain the desired material.

In the second embodiment, the two or more kinds of yttrium-aluminum-garnet fluorescent materials activated with cerium of different compositions may be either used by mixing or arranged independently (laminated, for example). When the two or more kinds of fluorescent materials are mixed, color converting portion can be formed relatively easily and in a manner suitable for mass production. When the two or more kinds of fluorescent materials are arranged independently, color can be adjusted after forming it by laminating the layers until a desired color can be obtained. Also when arranging the two or more kinds of fluorescent materials independently, it is preferable to arrange a fluorescent material that absorbs light from the light emitting component of a shorter wavelength near to the LED element, and a fluorescent material that absorbs light of a longer wavelength away from the LED element. This arrangement enables efficient absorption and emission of light.

Figure 6:
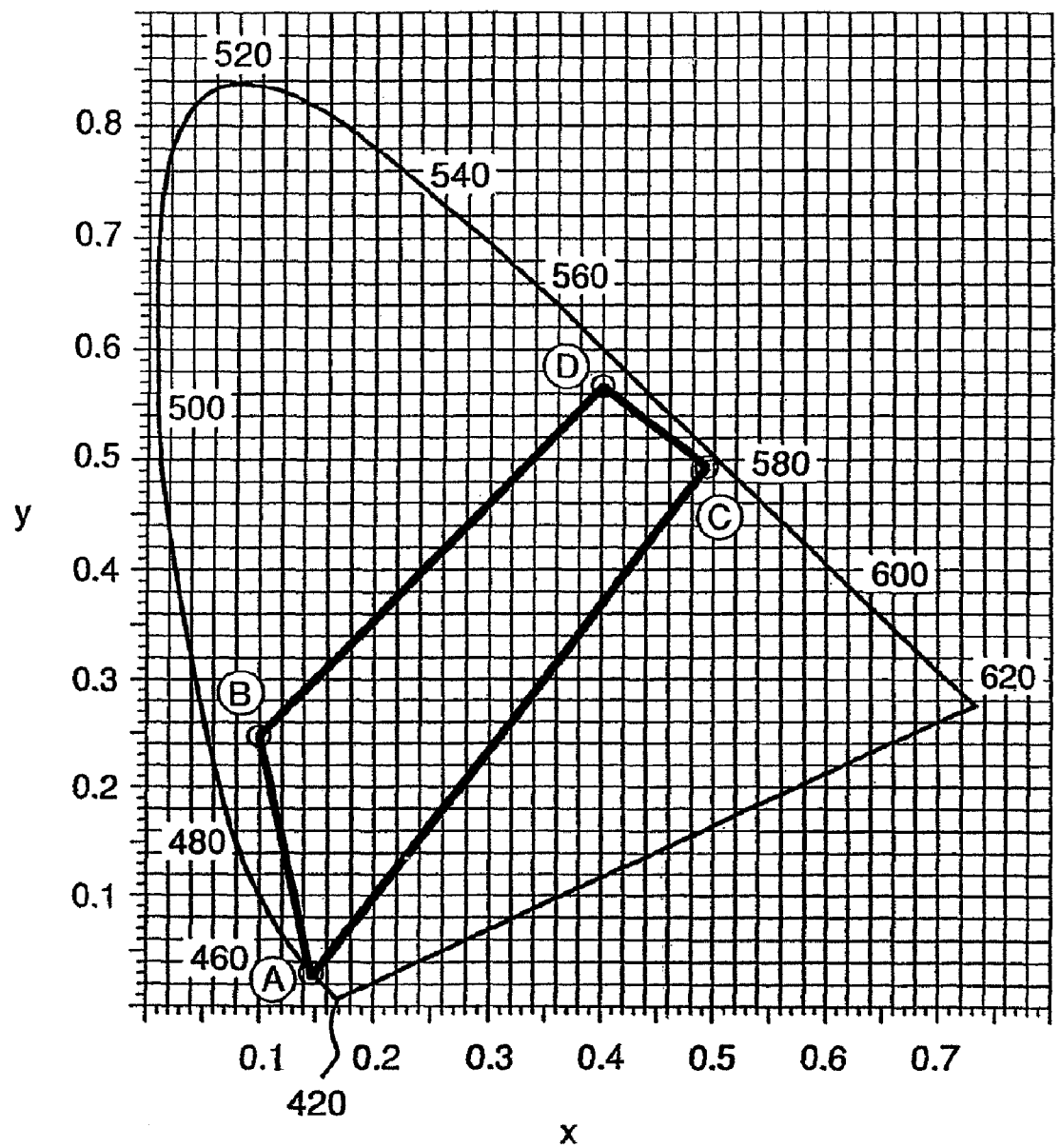
FIG. 6 shows the chromaticity diagram of light emitted by the light emitting diode of the second embodiment, while points A and B indicate the colors of light emitted by the light emitting component and points C and D indicate the colors of light emitted by two kinds of phosphors.

The light emitting diode of the second embodiment is made by using two or more kinds of yttrium-aluminum-garnet fluorescent materials of different compositions as the fluorescent materials, as described above. This makes it possible to make a light emitting diode capable of emitting light of desired color efficiently. That is, when wavelength of light emitted by the semiconductor light emitting component corresponds to a point on the straight line connecting point A and point B in the chromaticity diagram of FIG. 6, light of any color in the shaded region enclosed by points A, B, C and D in FIG. 6 which is the chromaticity points (points C and D) of the two or more kinds of yttrium-aluminum-garnet fluorescent materials of different compositions can be emitted. According to the second embodiment, color can be controlled by changing the compositions or quantities of the LED elements and fluorescent materials. In particular, a light emitting diode of less variation in the emission wavelength can be made by selecting the fluorescent materials according to the emission wavelength of the LED element, thereby compensating for the variation of the emission wavelength of the LED element. Also a light emitting diode including RGB components with high luminance can be made by selecting the emission wavelength of the fluorescent materials.

Moreover, because the yttrium-aluminum-garnet (YAG) fluorescent material used in the second embodiment has garnet structure, the light emitting diode of the second embodiment can emit light of high luminance for a long period of time. Also the light emitting diodes of the first embodiment and the second embodiment are provided with light emitting component installed via fluorescent material. Also because the converted light has longer wavelength than that of the light emitted by the light emitting component, energy of the converted light is less than the band gap of the nitride semiconductor, and is less likely to be absorbed by the nitride semiconductor layer. Thus, although the light emitted by the fluorescent material is directed also to the LED element because of the isotropy of emission, the light emitted by the fluorescent material is never absorbed by the LED element, and therefore the emission efficiency of the light emitting diode will not be decreased.

(Planar Light Source)

Figure 7:
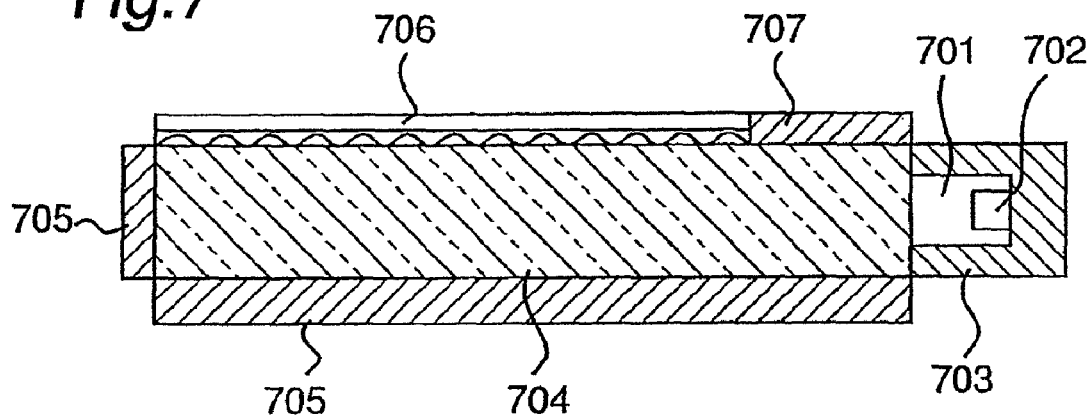
FIG. 7 is a schematic sectional view of the planar light source according to another embodiment of the present invention.

A planar light source which is another embodiment of the present invention is shown in FIG. 7.

In the planar light source shown in the FIG. 7, the phosphor used in the first embodiment or the second embodiment is contained in a coating material 701. With this configuration, blue light emitted by the gallium nitride semiconductor is color-converted and is output in planar state via an optical guide plate 704 and a dispersive sheet 706.

Specifically, a light emitting component 702 of the planar light source of FIG. 7 is secured in a metal substrate 703 of inverted C shape whereon an insulation layer and a conductive pattern (not shown) are formed. After electrically connecting the electrode of the light emitting component and the conductive pattern, phosphor is mixed with epoxy resin and applied into the inverse C-shaped metal substrate 703 whereon the light emitting component 702 is mounted. The light emitting component thus secured is fixed onto an end face of an acrylic optical guide plate 704 by means of an epoxy resin. A reflector film 707 containing a white diffusion agent is arranged on one of principal planes of the optical guide plate 704 where the dispersive sheet 706 is not formed, for the purpose of preventing fluorescence.

Similarly, a reflector 705 is provided on the entire surface on the back of the optical guide plate 704 and on one end face where the light emitting component is not provided, in order to improve the light emission efficiency. With this configuration, light emitting diodes for planar light emission which generates enough luminance for the back light of LCD can be made.

Application of the light emitting diode for planar light emission to a liquid crystal display can be achieved by arranging a polarizer plate on one principal plane of the optical guide plate 704 via liquid crystal injected between glass substrates (not shown) whereon a translucent conductive pattern is formed.

Figure 8:
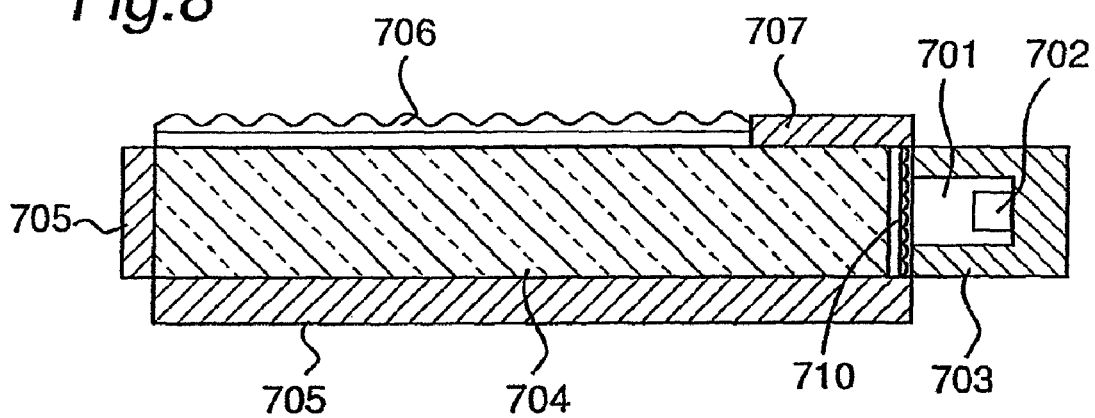
FIG. 8 is a schematic sectional view of another planar light source different from that of FIG. 7.

Now referring to FIG. 8 and FIG. 9, a planar light source according to another embodiment of the present invention will be described below. The light emitting device shown in FIG. 8 is made in such a configuration that blue light emitted by the light emitting diode 702 is converted to white light by a color converter 701 which contains phosphor and is output in planar state via an optical guide plate 704.

Figure 9:
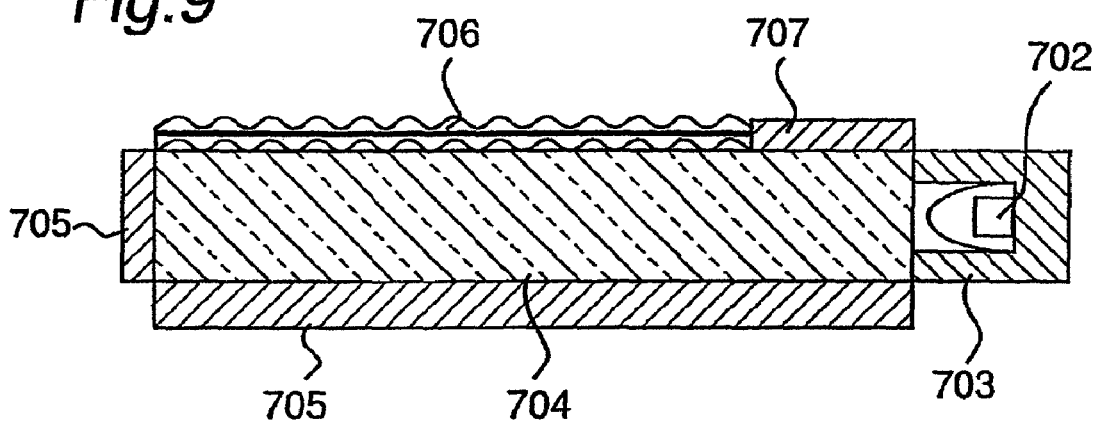
FIG. 9 is a schematic sectional view of another planar light source different from those of FIG. 7 and FIG. 8.

The light emitting device shown in FIG. 9 is made in such a configuration that blue light emitted by the light emitting component 702 is turned to planar state by the optical guide plate 704, then converted to white light by a dispersive sheet 706 which contains phosphor formed on one of the principal plane of the optical guide plate 704, thereby to output white light in planar state. The phosphor may be either contained in the dispersive sheet 706 or formed in a sheet by spreading it together with a binder resin over the dispersive sheet 706. Further, the binder including the phosphor may be formed in dots, not sheet, directly on the optical guide plate 704.

Application (Display Device)

Figure 10:
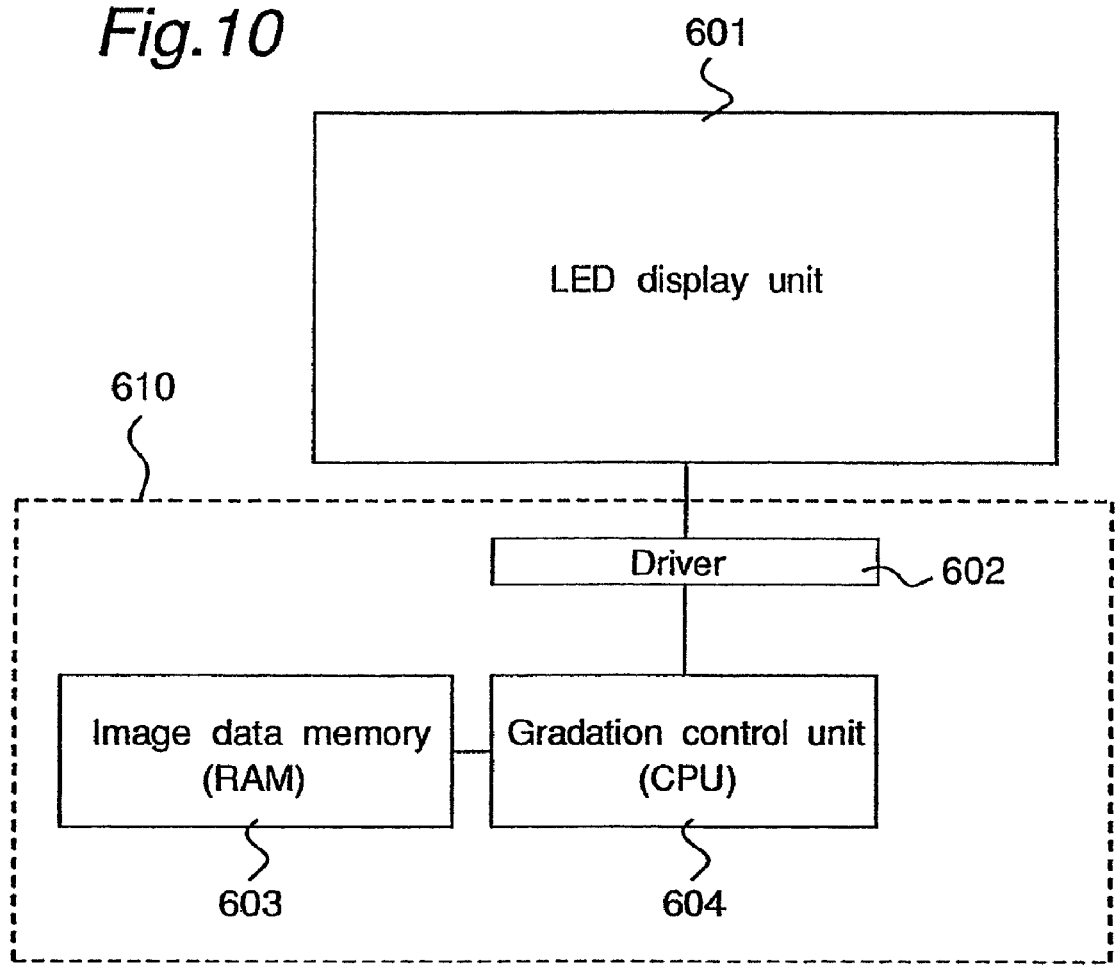
FIG. 10 is a block diagram of a display device which is an application of the present invention.
Figure 11:
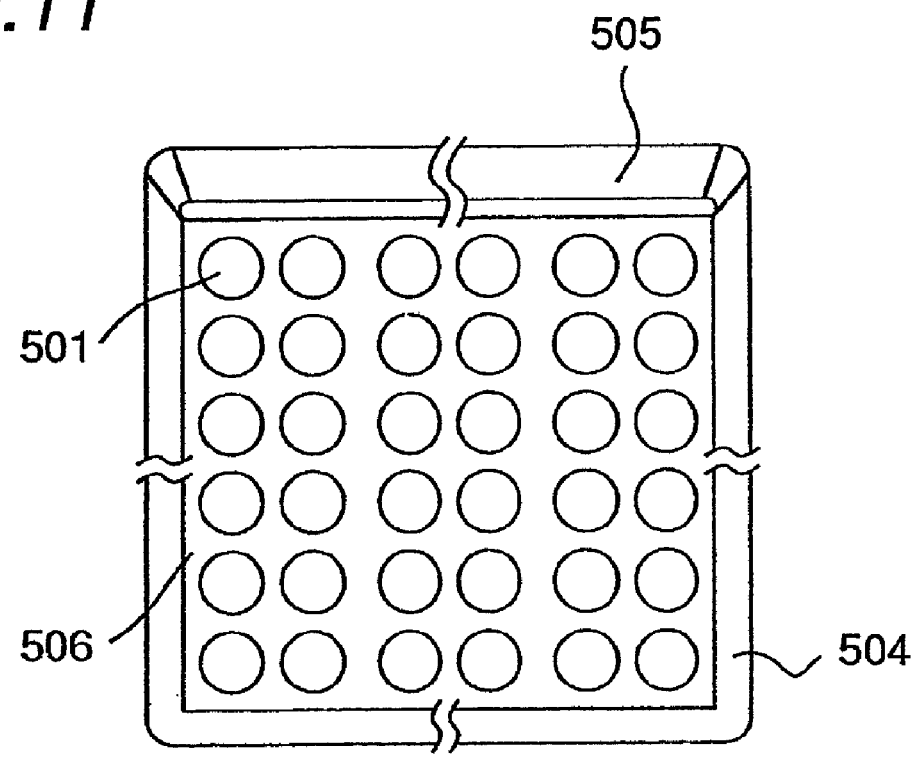
FIG. 11 is a plan view of the LED display device of the display device of FIG. 10.

Now a display device according to the present invention will be described below. FIG. 10 is a block diagram showing the configuration of the display device according to the present invention. As shown in FIG. 10, the display device comprises an LED display device 601 and a drive circuit 610 having a driver 602, video data storage means 603 and tone control means 604. The LED display device 601, having white light emitting diodes 501 shown in FIG. 1 or FIG. 2 arranged in matrix configuration in a casing 504 as shown in FIG. 11, is used as monochromatic LED display device. The casing 504 is provided with a light blocking material 505 being formed integrally therewith.

The drive circuit 610 has the video data storage means (RAM) 603 for temporarily storing display data which is input, the tone control means 604 which computes and outputs tone signals for controlling the individual light emitting diodes of the LED display device 601 to light with the specified brightness according to the data read from RAM 603, and the driver 602 which is switched by signals supplied from the tone control means 604 to drive the light emitting diode to light. The tone control circuit 604 retrieves data from the RAM 603 and computes the duration of lighting the light emitting diodes of the LED display device 601, then outputs pulse signals for turning on and off the light emitting diodes to the LED display device 601. In the display device constituted as described above, the LED display device 601 is capable of displaying images according to the pulse signals which are input from the drive circuit, and has the following advantages.

The LED display device which displays with white light by using light emitting diodes of three colors, RGB, is required to display while controlling the light emission output of the R, G and B light emitting diodes and accordingly must control the light emitting diodes by taking the emission intensity, temperature characteristics and other factors of the light emitting diodes into account, resulting in complicate configuration of the drive circuit which drives the LED display device. In the display device of the present invention, however, because the LED display device 601 is constituted by using light emitting diodes 501 of the present invention which can emit white light without using light emitting diodes of three kinds, RGB, it is not necessary for the drive circuit to individually control the R, G and B light emitting diodes, making it possible to simplify the configuration of the drive circuit and make the display device at a low cost.

With an LED display device which displays in white light by using light emitting diodes of three kinds, RGB, the three light emitting diodes must be illuminated at the same time and the light from the light emitting diodes must be mixed in order to display white light by combining the three RGB light emitting diodes for each pixel, resulting in a large display area for each pixel and making it impossible to display with high definition. The LED display device of the display device according to the present invention, in contrast, can display with white light can be done with a single light emitting diode, and is therefore capable of display with white light of higher definition. Further, with the LED display device which displays by mixing the colors of three light emitting diodes, there is such a case as the display color changes due to blocking of some of the RGB light emitting diodes depending on the viewing angle, the LED display device of the present invention has no such problem.

As described above, the display device provided with the LED display device employing the light emitting diode of the present invention which is capable of emitting white light is capable of displaying stable white light with higher definition and has an advantage of less color unevenness. The LED display device of the present invention which is capable of displaying with white light also imposes less stimulation to the eye compared to the conventional LED display device which employs only red and green colors, and is therefore suited for use over a long period of time.

Figure 12:
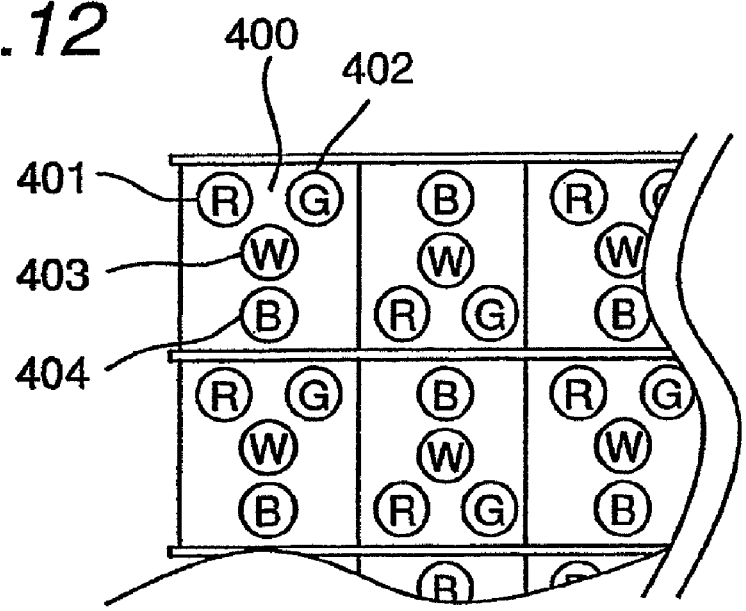
FIG. 12 is a plan view of the LED display device wherein one pixel is constituted from four light emitting diodes including the light emitting diode of the present invention and those emitting ROB colors.

Embodiment of Another Display Device Employing the Light Emitting Diode of the Present Invention The light emitting diode of the present invention can be used to constitute an LED display device wherein one pixel is constituted of three RGB light emitting diodes and one light emitting diode of the present invention, as shown in FIG. 12. By connecting the LED display device and a specified drive circuit, a display device capable of displaying various images can be constituted. The drive circuit of this display device has, similarly to a case of monochrome display device, video data storage means (RAM) for temporarily storing the input display data, a tone control circuit which processes the data stored in the RAM to compute tone signals for lighting the light emitting diodes with specified brightness and a driver which is switched by the output signal of the tone control circuit to cause the light emitting diodes to illuminate. The drive circuit is required exclusively for each of the RGB light emitting diodes and the white light emitting diode. The tone control circuit computes the duration of lighting the light emitting diodes from the data stored in the RAM, and outputs pulse signals for turning on and off the light emitting diodes. When displaying with white light, width of the pulse signals for lighting the RGB light emitting diodes is made shorter, or peak value of the pulse signal is made lower or no pulse signal is output at all. On the other hand, a pulse signal is given to the white light emitting diode in compensation thereof. This causes the LED display device to display with white light.

As described above, brightness of display can be improved by adding the white light emitting diode to the RGB light emitting diodes. When RGB light emitting diodes are combined to display white light, one or two of the RGB colors may be enhanced resulting in a failure to display pure white depending on the viewing angle, such a problem is solved by adding the white light emitting diode as in this display device.

For the drive circuit of such a display device as described above, it is preferable that a CPU be provided separately as a tone control circuit which computes the pulse signal for lighting the white light emitting diode with specified brightness. The pulse signal which is output from the tone control circuit is given to the white light emitting diode driver thereby to switch the driver. The white light emitting diode illuminates when the driver is turned on, and goes out when the driver is turned off.

(Traffic Signal)

When the light emitting diode of the present invention is used as a traffic signal which is a kind of display device, such advantages can be obtained as stable illumination over a long period of time and no color unevenness even when part of the light emitting diodes go out. The traffic signal employing the light emitting diode of the present invention has such a configuration as white light emitting diodes are arranged on a substrate whereon a conductive pattern is formed. A circuit of light emitting diodes wherein such light emitting diodes are connected in series or parallel is handled as a set of light emitting diodes. Two or more sets of the light emitting diodes are used, each having the light emitting diodes arranged in spiral configuration. When all light emitting diodes are arranged, they are arranged over the entire area in circular configuration. After connecting power lines by soldering for the connection of the light emitting diodes and the substrate with external power supply, it is secured in a chassis of railway signal. The LED display device is placed in an aluminum diecast chassis equipped with a light blocking member and is sealed on the surface with silicon rubber filler. The chassis is provided with a white color lens on the display plane thereof. Electric wiring of the LED display device is passed through a rubber packing on the back of the chassis, for sealing off the inside of the chassis from the outside, with the inside of the chassis closed. Thus a signal of white light is made. A signal of higher reliability can be made by dividing the light emitting diodes of the present invention into a plurality of groups and arranging them in a spiral configuration swirling from a center toward outside, while connecting them in parallel. The configuration of swirling from the center toward outside may be either continuous or intermittent. Therefore, desired number of the light emitting diodes and desired number of the sets of light emitting diodes can be selected depending on the display area of the LED display device. This signal is, even when one of the sets of light emitting diodes or part of the light emitting diodes fail to illuminate due to some trouble, capable of illuminate evenly in a circular configuration without color shift by means of the remaining set of light emitting diodes or remaining light emitting diodes. Because the light emitting diodes are arranged in a spiral configuration, they can be arranged more densely near the center, and driven without any different impression from signals employing incandescent lamps.

EXAMPLES

The following Examples further illustrate the present invention in detail but are not to be construed to limit the scope thereof.

Example 1

Example 1 provides a light emitting component having an emission peak at 450 nm and a half width of 30 nm employing a GaInN semiconductor. The light emitting component of the present invention is made by flowing TMG (trimethyl gallium) gas, TMI (trimethyl indium) gas, nitrogen gas and dopant gas together with a carrier gas on a cleaned sapphire substrate and forming a gallium nitride compound semiconductor layer in MOCVD process. A gallium nitride semiconductor having N type conductivity and a gallium nitride semiconductor having P type conductivity are formed by switching $SiH_4$ and $Cp_2Mg$ as dopant gas. The LED element of Example 1 has a contact layer which is a gallium nitride semiconductor having N type conductivity, a clad layer which is a gallium nitride aluminum semiconductor having P type conductivity and a contact layer which is a gallium nitride semiconductor having P type conductivity, and formed between the contact layer having N type conductivity and the clad layer having P type conductivity is a non-doped InGaN activation layer of thickness about 3 nm for making a single quantum well structure. The sapphire substrate has a gallium nitride semiconductor layer formed thereon under a low temperature to make a buffer layer. The P type semiconductor is annealed at a temperature of 400° C. or above after forming the film.

After exposing the surfaces of P type and N type semiconductor layers by etching, n and p electrodes are formed by sputtering. After scribing the semiconductor wafer which has been made as described above, light emitting components are made by dividing the wafer with external force.

The light emitting component made in the above process is mounted in a cup of a mount lead which is made of silver-plated steel by die bonding with epoxy resin. Then electrodes of the light emitting component, the mount lead and the inner lead are electrically connected by wire boding with gold wires 30 μm in diameter, to make a light emitting diode of lead type.

A phosphor is made by dissolving rare earth elements of Y, Gd and Ce in an acid in stoichiometrical proportions, and coprecipitating the solution with oxalic acid. Oxide of the coprecipitate obtained by firing this material is mixed with aluminum oxide, thereby to obtain the mixture material. The mixture was then mixed with ammonium fluoride used as a flux, and fired in a crucible at a temperature of 1400° C. in air for 3 hours. Then the fired material is ground by a ball mill in water, washed, separated, dried and sieved thereby to obtained the desired material. Phosphor made as describe above is yttrium-aluminum-garnet fluorescent material represented by general formula $(Y_{0.8}Gd_{0.2})_3Al_5O_{12}$:Ce where about 20% of Y is substituted with Gd and substitution ratio of Ce is 0.03.

80 Parts by weight of the fluorescent material having a composition of $(Y_{0.8}Gd_{0.2})_3Al_5O_{12}$:Ce which has been made in the above process and 100 parts by weight of epoxy resin are sufficiently mixed to turn into slurry. The slurry is poured into the cup provided on the mount lead whereon the light emitting component is mounted. After pouring, the slurry is cured at 130° C. for one hour. Thus a coating having a thickness of 120 μm, which contains the phosphor, is formed on the light emitting component. In Example 1, the coating is formed to contain the phosphor in gradually increasing concentration toward the light emitting component. Irradiation intensity is about 3.5 W/cm2. The light emitting component and the phosphor are molded with translucent epoxy resin for the purpose of protection against extraneous stress, moisture and dust. A lead frame with the coating layer of phosphor formed thereon is placed in a bullet-shaped die and mixed with translucent epoxy resin and then cured at 150° C. for 5 hours.

Under visual observation of the light emitting diode formed as described above in the direction normal to the light emitting plane, it was found that the central portion was rendered yellowish color due to the body color of the phosphor.

Measurements of chromaticity point, color temperature and color rendering index of the light emitting diode made as described above and capable of emitting white light gave values of (0.302, 0.280) for chromaticity point (x, y), color temperature of 8080 K and 87.5 for color rendering index (Ra) which are approximate to the characteristics of a 3-waveform fluorescent lamp. Light emitting efficiency was 9.5 lm/W, comparable to that of an incandescent lamp. Further in life tests under conditions of energization with a current of 60 mA at 25° C., 20 mA at 25° C. and 20 mA at 60° C. with 90% RH, no change due to the fluorescent material was observed, proving that the light emitting diode had no difference in service life from the conventional blue light emitting diode.

Comparative Example 1

Formation of a light emitting diode and life tests thereof were conducted in the same manner as in Example 1 except for changing the phosphor from $(Y_{0.8}Gd_{0.2})_3Al_5O_{12}$:Ce to (ZnCd)S:Cu, Al. The light emitting diode which had been formed showed, immediately after energization, emission of white light but with low luminance. In a life test, the output diminished to zero in about 100 hours. Analysis of the cause of deterioration showed that the fluorescent material was blackened.

Figure 13A:
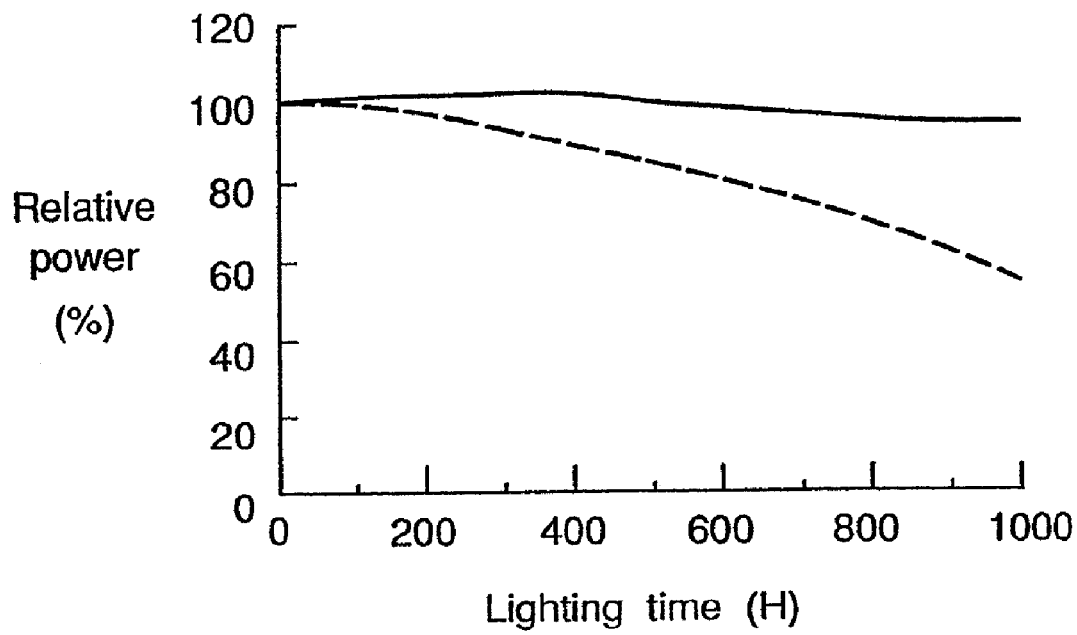
FIG. 13A shows the results of durable life test of the light emitting diodes of Example 1 and Comparative Example 1, showing the results at 25° C.
Figure 13B:
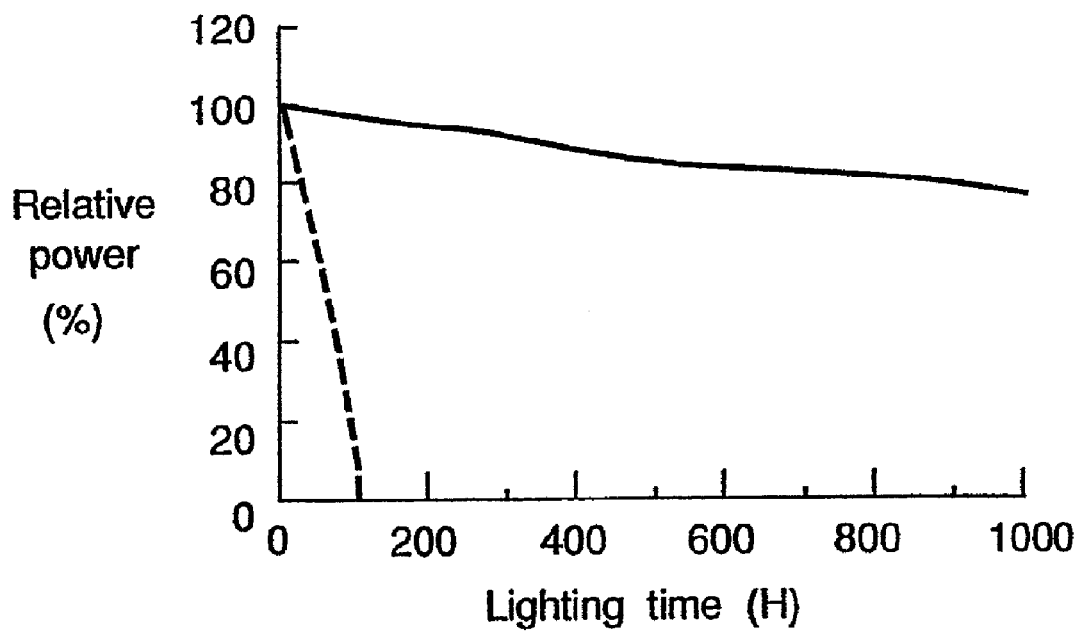
FIG. 13B shows the results of durable life test of the light emitting diodes of Example 1 and Comparative Example 1, showing the results at 60° C. and 90% RH.

This trouble is supposed to have been caused as the light emitted by the light emitting component and moisture which had caught on the fluorescent material or entered from the outside brought about photolysis to make colloidal zinc to precipitate on the surface of the fluorescent material, resulting in blackened surface. Results of life tests under conditions of energization with a current of 20 mA at 25° C. and 20 mA at 60° C. with 90% RH are shown in FIG. 13 together with the results of Example 1. Luminance is given in terms of relative value with respect to the initial value as the reference. A solid line indicates Example 1 and a wavy line indicates Comparative Example 1 in FIG. 13.

Example 2

In Example 2, a light emitting component was made in the same manner as in Example 1 except for increasing the content of In in the nitride compound semiconductor of the light emitting component to have the emission peak at 460 nm and increasing the content of Gd in phosphor than that of Example 1 to have a composition of $(Y0.6Gd0.4)3Al5O12:Ce$.

Figure 18A:
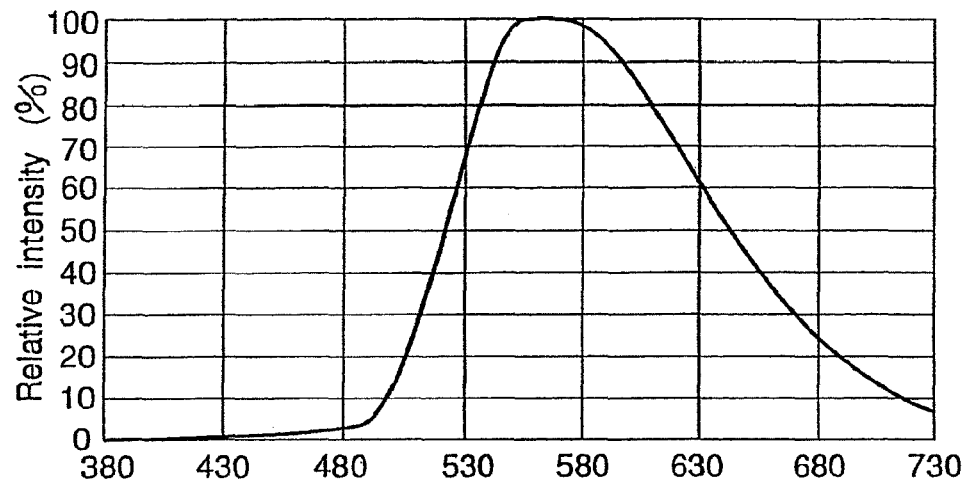
FIG. 18A shows the emission spectrum of the phosphor $(Y_{0.6}Gd_{0.4})_3Al_5O_{12}$:Ce of Example 18A.
Figure 18B:
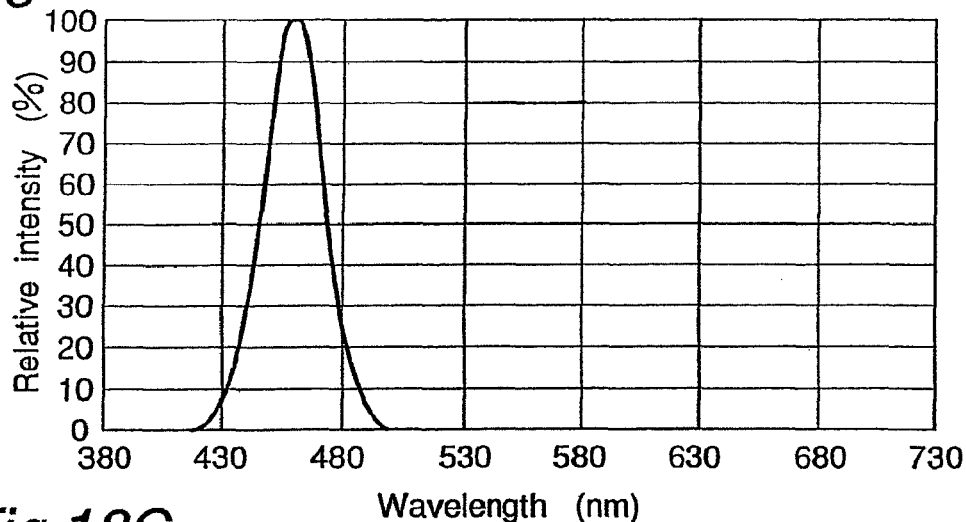
FIG. 18B shows the emission spectrum of the light emitting component of Example 18B having the emission peak wavelength of 460 nm.
Figure 18C:
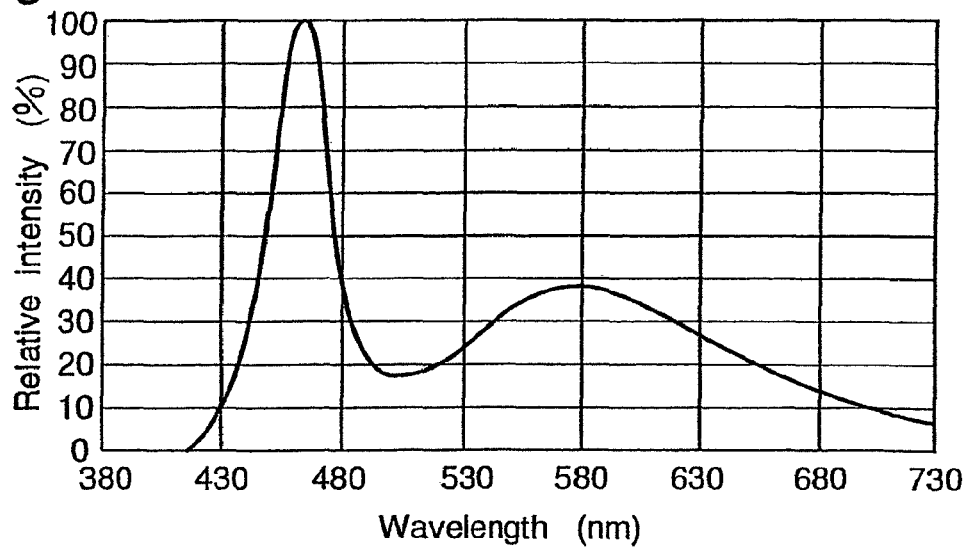
FIG. 18C shows the emission spectrum of the light emitting diode of Example 2.

Measurements of chromaticity point, color temperature and color rendering index of the light emitting diode, which were made as described above and capable of emitting white light, gave values of (0.375, 0.370) for chromaticity point (x, y), color temperature of 4400 K and 86.0 for color rendering index (Ra). FIG. 18A, FIG. 18B and FIG. 18C show the emission spectra of the phosphor, the light emitting component and the light emitting diode of Example 2, respectively.

100 pieces of the light emitting diodes of Example 2 were made and average luminous intensities thereof were taken after lighting for 1000 hours. In terms of percentage of the luminous intensity value before the life test, the average luminous intensity after the life test was 98.8%, proving no difference in the characteristic.

Example 3

100 light emitting diodes were made in the same manner as in Example 1 except for adding Sm in addition to rare earth elements Y, Gd and Ce in the phosphor to make a fluorescent material with composition of $(Y0.39Gd0.57Ce0.03Sm0.01)3Al5O12$. When the light emitting diodes were made illuminate at a high temperature of 130° C., average temperature characteristic about 8% better than that of Example 1 was obtained.

Example 4

LED display device of Example 4 is made of the light emitting diodes of Example 1 being arranged in a 16×16 matrix on a ceramics substrate whereon a copper pattern is formed as shown in FIG. 11. In the LED display device of Example 4, the substrate whereon the light emitting diodes are arranged is placed in a chassis 504 which is made of phenol resin and is provided with a light blocking member 505 being formed integrally therewith. The chassis, the light emitting diodes, the substrate and part of the light blocking member, except for the tips of the light emitting diodes, are covered with silicon rubber 506 colored in black with a pigment. The substrate and the light emitting diodes are soldered by means of an automatic soldering machine.

The LED display device made in the configuration described above, a RAM which temporarily stores the input display data, a tone control circuit which processes the data stored in the RAM to compute tone signals for lighting the light emitting diodes with specified brightness and drive means which is switched by the output signal of the tone control circuit to cause the light emitting diodes to illuminate are electrically connected to make an LED display device. By driving the LED display devices, it was verified that the apparatus can be used as black and white LED display device.

Example 5

The light emitting diode of Example 5 was made in the same manner as in Example 1 except for using phosphor represented by general formula $(Y0.2Gd0.8)3Al5O12:Ce$. 100 pieces of the light emitting diodes of Example 5 were made and measured for various characteristics.

Figure 19A:
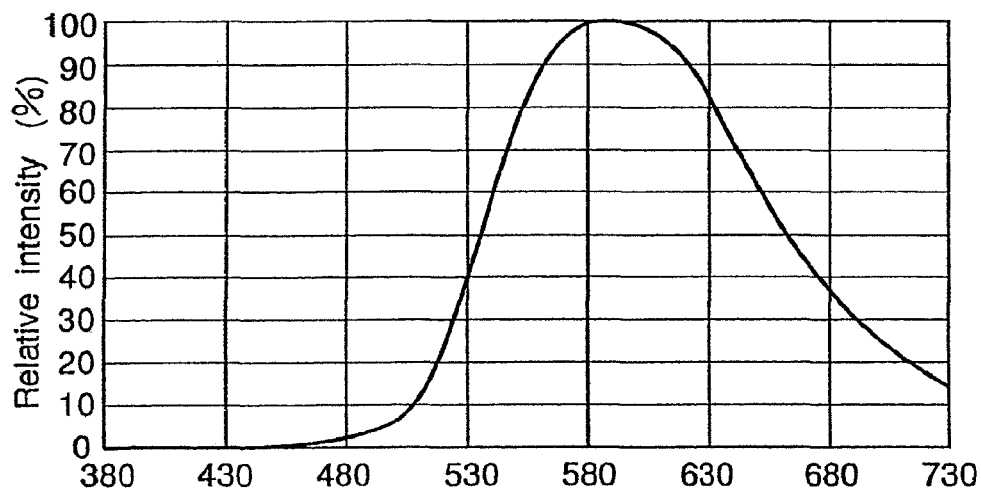
FIG. 19A shows the emission spectrum of the phosphor $(Y_{0.2}Gd_{0.8})_3Al_5O_{12}$:Ce of Example 5.
Figure 19B:
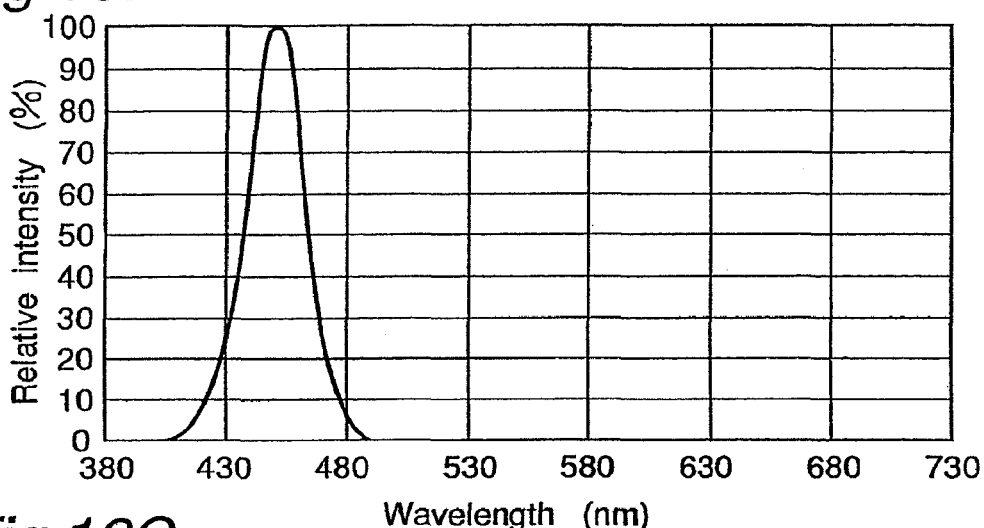
FIG. 19B shows the emission spectrum of the light emitting component of Example 5 having the emission peak wavelength of 450 nm.
Figure 19C:
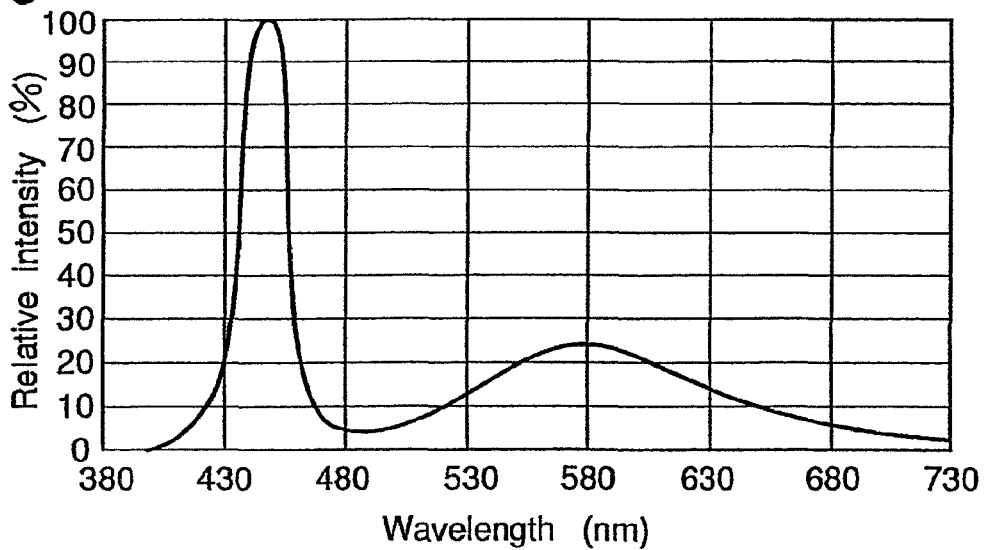
FIG. 19C shows the emission spectrum of the light emitting diode of Example 5.

Measurement of chromaticity point gave values of (0.450, 0.420) in average for chromaticity point (x, y), and light of incandescent lamp color was emitted. FIG. 19A, FIG. 19B and FIG. 19C show the emission spectra of the phosphor, the light emitting component and the light emitting diode of Example 5, respectively. Although the light emitting diodes of Example 5 showed luminance about 40% lower than that of the light emitting diodes of Example 5, showed good weatherability comparable to that of Example 1 in life test.

Example 6

The light emitting diode of Example 6 was made in the same manner as in Example 1 except for using phosphor represented by general formula $Y_3Al_5O_{12}:Ce$. 100 pieces of the light emitting diodes of Example 6 were made and measured for various characteristics.

Figure 20A:
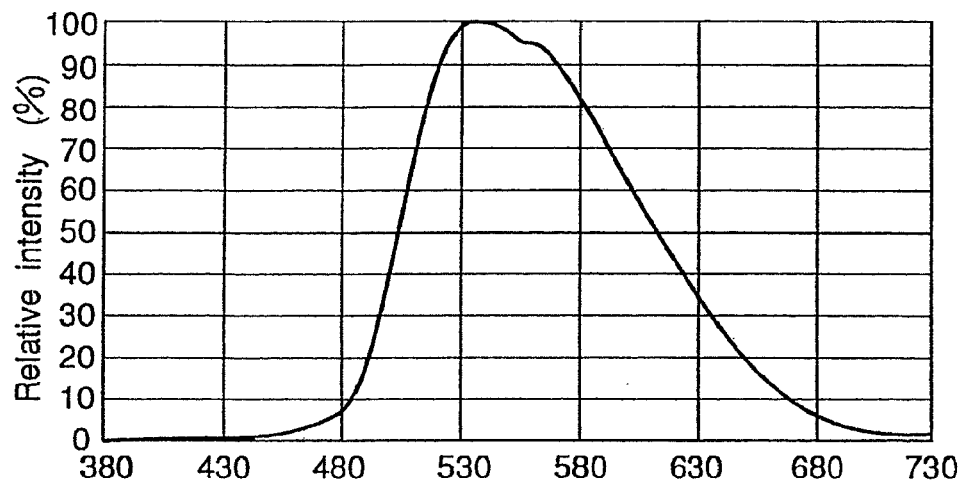
FIG. 20A shows the emission spectrum of the phosphor $Y_3Al_5O_{12}$:Ce of Example 6.
Figure 20B:
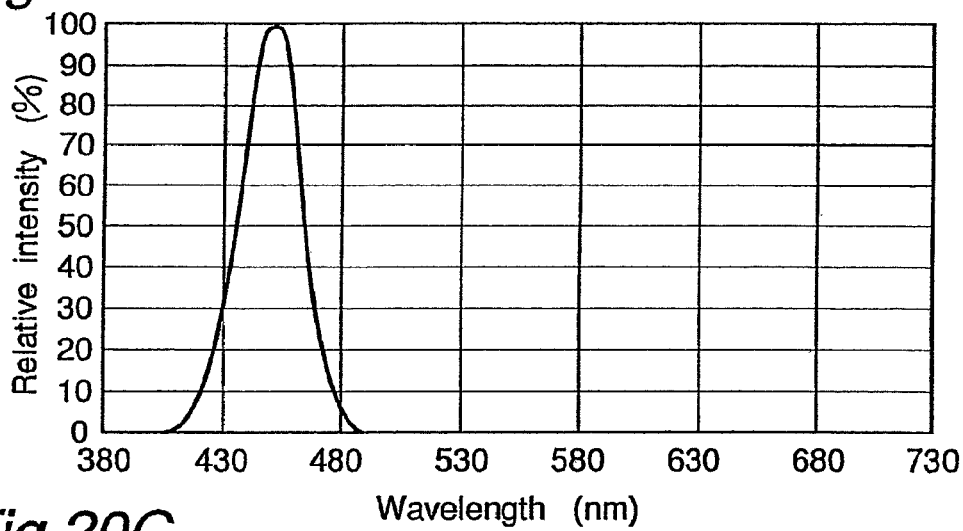
FIG. 20B shows the emission spectrum of the light emitting component of Example 6 having the emission peak wavelength of 450 nm.
Figure 20C:
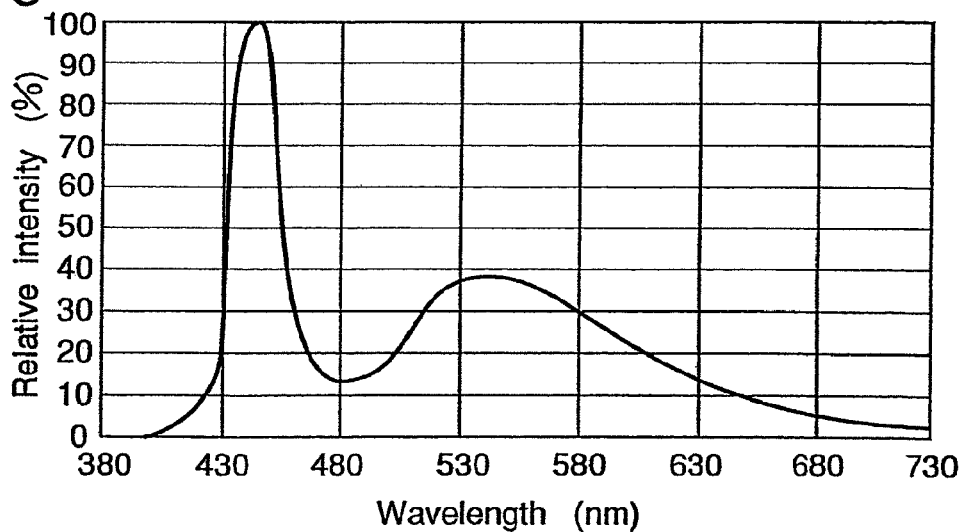
FIG. 20C shows the emission spectrum of the light emitting diode of Example 6.

Measurement of chromaticity point slightly yellow-greenish white light compared to Example 1 was emitted. The light emitting diode of Example 6 showed good weatherability similar to that of Example 1 in life test. FIG. 20A, FIG. 20B and FIG. 20C show the emission spectra of the phosphor, the light emitting component and the light emitting diode of Example 6, respectively.

Example 7

The light emitting diode of Example 7 was made in the same manner as in Example 1 except for using phosphor represented by general formula $Y3(Al0.5Ga0.5)5O12:Ce$. 100 pieces of the light emitting diodes of Example 7 were made and measured for various characteristics.

Figure 21A:
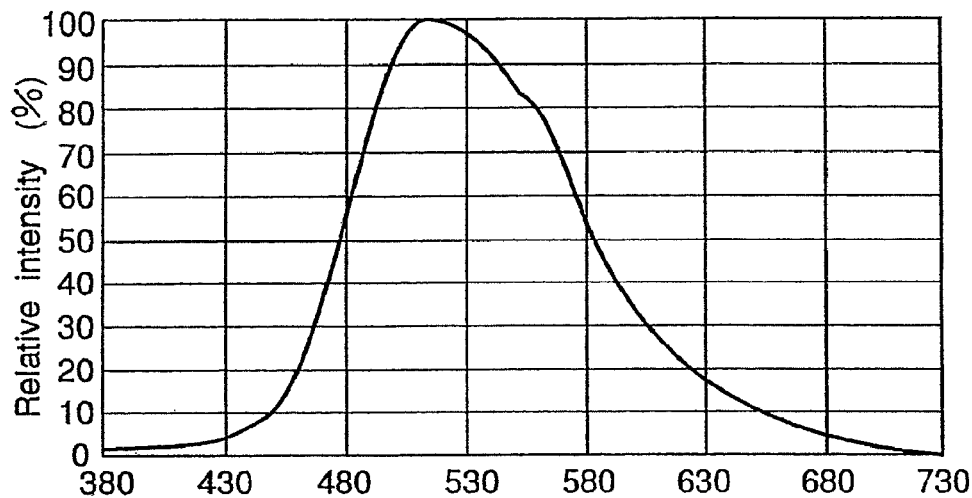
FIG. 21A shows the emission spectrum of the phosphor $Y_3(Al_{0.5}Ga_{0.5})_5O_{12}$:Ce of the seventh embodiment of the present invention.
Figure 21B:
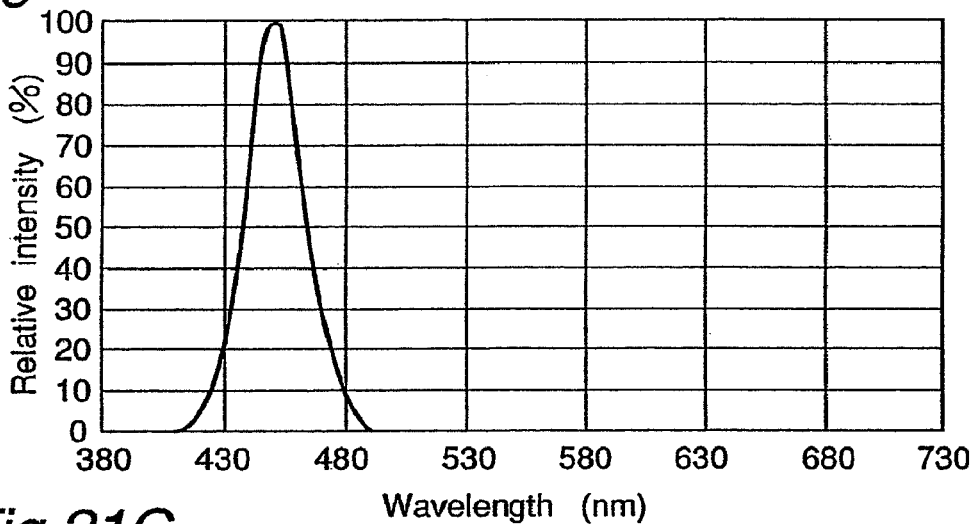
FIG. 21B shows the emission spectrum of the light emitting component of Example 7 having the emission peak wavelength of 450 nm.
Figure 21C:
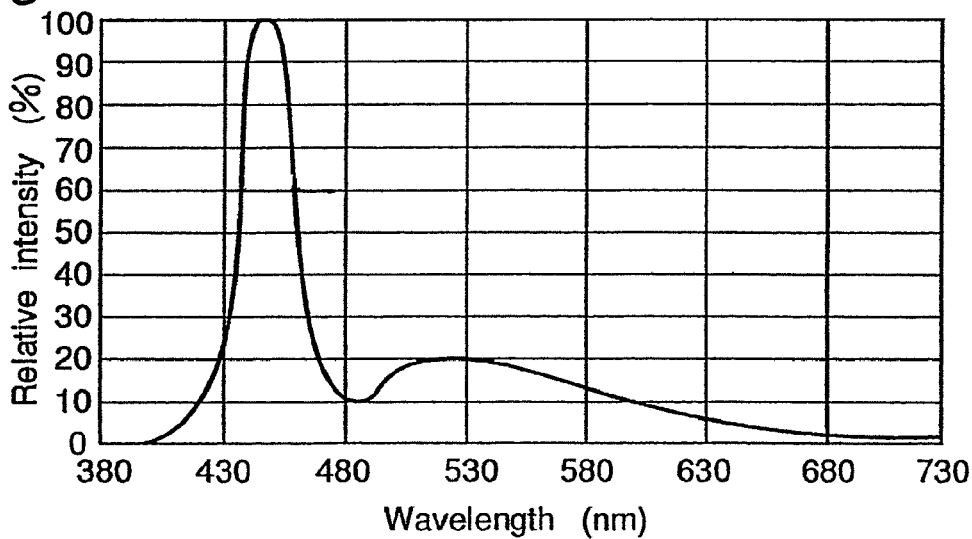
FIG. 21C shows the emission spectrum of the light emitting diode of Example 7.

Although the light emitting diodes of Example 7 showed a low luminance, emitted greenish white light and showed good weatherability similar to that of Example 1 in life test. FIG. 21A, FIG. 21B and FIG. 21C show the emission spectra of the phosphor, the light emitting component and the light emitting diode of Example 7, respectively.

Example 8

The light emitting diode of Example 8 was made in the same manner as in Example 1 except for using phosphor represented by general formula $Gd3(Al0.5Ga0.5)5O12:Ce$ which does not contain Y. 100 pieces of the light emitting diodes of Example 8 were made and measured for various characteristics.

Although the light emitting diodes of Example 8 showed a low luminance, showed good weatherability similar to that of Example 1 in life test.

Example 9

Light emitting diode of Example 9 is planar light emitting device having the configuration shown in FIG. 7.

In $0.05Ga0.95N$ semiconductor having emission peak at 450 nm is used as a light emitting component. Light emitting components are made by flowing TMG (trimethyl gallium) gas, TMI (trimethyl indium) gas, nitrogen gas and dopant gas together with a carrier gas on a cleaned sapphire substrate and forming a gallium nitride compound semiconductor layer in MOCVD process. A gallium nitride semiconductor layer having N type conductivity and a gallium nitride semiconductor layer having P type conductivity are formed by switching $SiH4$ and $Cp2Mg$ as dopant gas, thereby forming a PN junction. For the semiconductor light emitting component, a contact layer which is gallium nitride semiconductor having N type conductivity, a clad layer which is gallium nitride aluminum semiconductor having N type conductivity, a clad layer which is gallium nitride aluminum semiconductor having P type conductivity and a contact layer which is gallium nitride semiconductor having P type conductivity are formed. An activation layer of Zn-doped InGaN which makes a double-hetero junction is formed between the clad layer having N type conductivity and the clad layer having P type conductivity. A buffer layer is provided on the sapphire substrate by forming gallium nitride semiconductor layer at a low temperature. The P type nitride semiconductor layer is annealed at a temperature of 400° C. or above after forming the film.

After forming the semiconductor layers and exposing the surfaces of P type and N type semiconductor layers by etching, electrodes are formed by sputtering. After scribing the semiconductor wafer which has been made as described above, light emitting components are made as light emitting components by dividing the wafer with external force.

The light emitting component is mounted on a mount lead which has a cup at the tip of a silver-plated copper lead frame, by die bonding with epoxy resin. Electrodes of the light emitting component, the mount lead and the inner lead are electrically connected by wire boding with gold wires having a diameter of 30 μm.

The lead frame with the light emitting component attached thereon is placed in a bullet-shaped die and sealed with translucent epoxy resin for molding, which is then cured at 150° C. for 5 hours, thereby to form a blue light emitting diode. The blue light emitting diode is connected to one end face of an acrylic optical guide plate which is polished on all end faces. On one surface and side face of the acrylic plate, screen printing is applied by using barium titanate dispersed in an acrylic binder as white color reflector, which is then cured.

Phosphor of green and red colors are made by dissolving rare earth elements of Y, Gd, Ce and La in acid in stoichiometrical proportions, and coprecipitating the solution with oxalic acid. Oxide of the coprecipitate obtained by firing this material is mixed with aluminum oxide and gallium oxide, thereby to obtain respective mixture materials. The mixture is then mixed with ammonium fluoride used as a flux, and fired in a crucible at a temperature of 1400° C. in air for 3 hours. Then the fired material is ground by a ball mill in water, washed, separated, dried and sieved thereby to obtained the desired material.

120 parts by weight of the first fluorescent material having a composition of $Y_3(Al_{0.6}Ga_{0.4})_5O_{12}:Ce$ and capable of emitting green light prepared as described above and 100 parts by weight of the second fluorescent material having a composition of $(Y_{0.4}Gd_{0.6})_3Al_5O_{12}:Ce$ and capable of emitting red light prepared in a process similar to that for the first fluorescent material, are sufficiently mixed with 100 parts by weight of epoxy resin, to form a slurry. The slurry is applied uniformly onto an acrylic layer having a thickness of 0.5 mm by means of a multi-coater, and dried to form a fluorescent material layer to be used as a color converting material having a thickness of about 30 μm. The fluorescent material layer is cut into the same size as that of the principal light emitting plane of the optical guide plate, and arranged on the optical guide plate thereby to form the planar light emitting device. Measurements of chromaticity point and color rendering index of the light emitting device gave values of (0.29, 0.34) for chromaticity point (x, y) and 92.0 for color rendering index (Ra) which are approximate to the properties of 3-waveform fluorescent lamp. Light emitting efficiency of 12 lm/W comparable to that of an incandescent lamp was obtained. Further in weatherability tests under conditions of energization with a current of 60 mA at room temperature, 20 mA at room temperature and 20 mA at 60° C. with 90% RH, no change due to the fluorescent material was observed.

Comparative Example 2

Figure 14A:
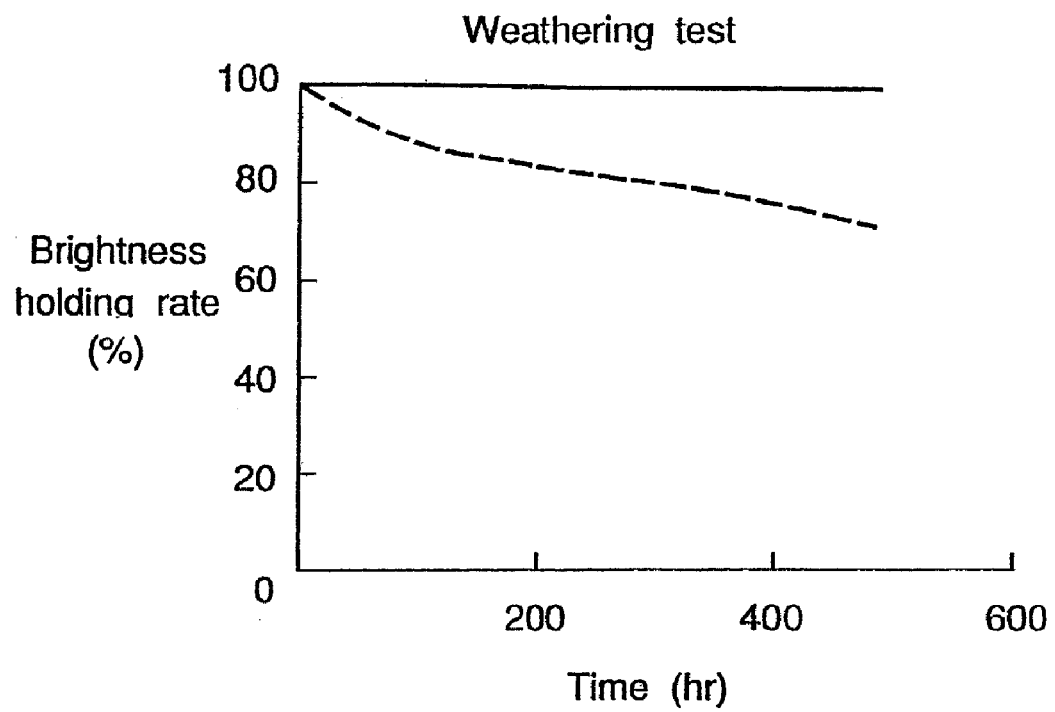
FIG. 14A shows the results of weatherability test of Example 9 and Comparative Example 2 showing the change of luminance retaining ratio with time and FIG. 14B shows the results of weatherability test of Example 9 and Comparative Example 2 showing the color tone before and after the test.
Figure 14B:
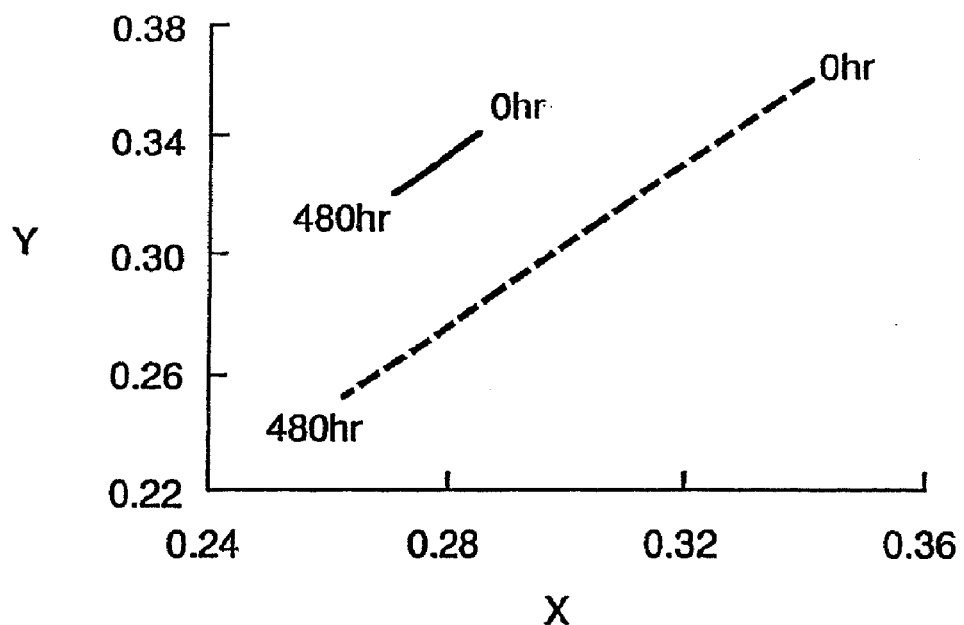
Figure 15A:
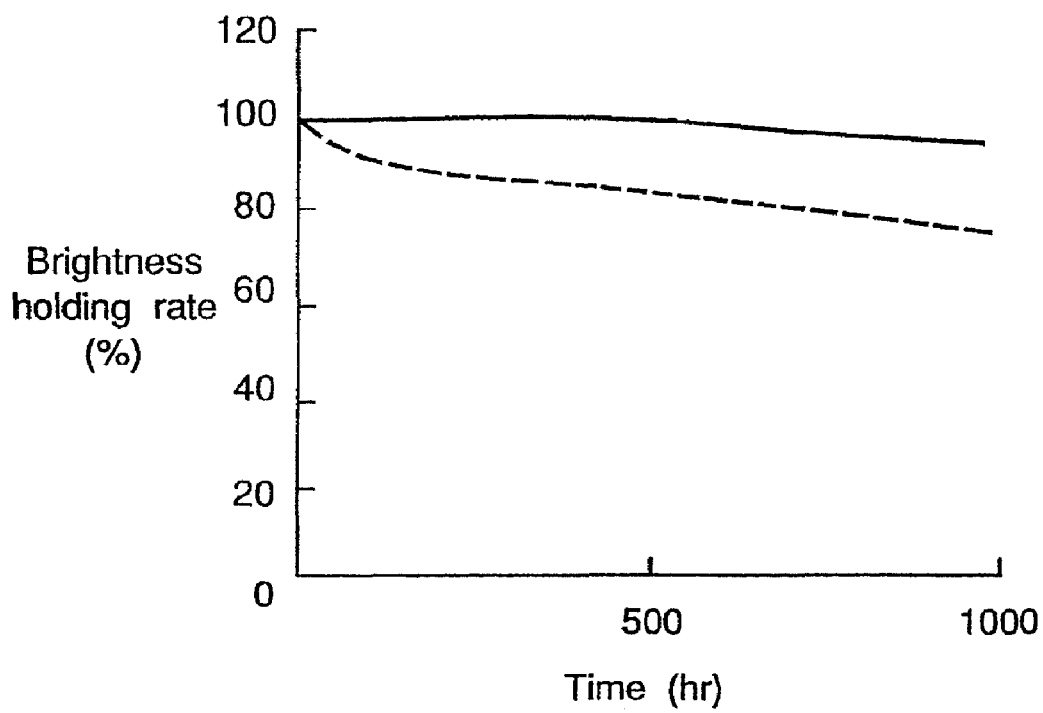
FIG. 15A shows the results of reliability test of Example 9 and Comparative Example 2 showing the relationship between the luminance retaining ratio and time.
Figure 15B:
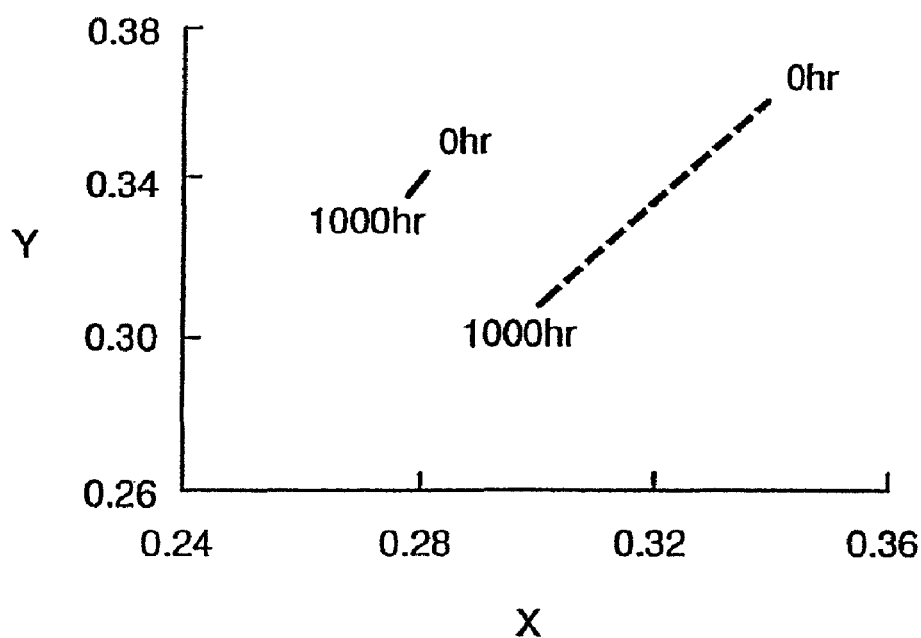
FIG. 15B is a graph showing the relationship between color tone and time.

Forming of light emitting diode and weatherability tests thereof were conducted in the same manner as in Example 9 except for mixing the same quantities of a green organic fluorescent pigment (FA-001 of Synleuch Chemisch) and a red organic fluorescent pigment (FA-005 of Synleuch Chemisch) which are perylene-derivatives, instead of the first fluorescent material represented by general formula $Y_3(Al_{0.6}Ga_{0.4})_5O_{12}:Ce$ capable of emitting green light and the second fluorescent material represented by general formula $(Y_{0.4}Gd_{0.6})_3Al_5O_{12}:Ce$ capable of emitting red light of Example 9. Chromaticity coordinates of the light emitting diode of Comparative Example 1 thus formed were (x, y)= (0.34, 0.35). Weatherability test was conducted by irradiating with ultraviolet ray generated by carbon arc for 200 hours, representing equivalent irradiation of sun light over a period of one year, while measuring the luminance retaining ratio and color tone at various times during the test period. In a reliability test, the light emitting component was energized to emit light at a constant temperature of 70° C. while measuring the luminance and color tone at different times. The results are shown in FIG. 14 and FIG. 15, together with Example 9. As will be clear from FIG. 14 and FIG. 15, the light emitting component of Example 9 experiences less deterioration than Comparative Example 2.

Example 10

The light emitting diode of Example 10 is a lead type light emitting diode.

In the light emitting diode of Example 10, the light emitting component having a light emitting layer of $In_{0.05}Ga_{0.95}N$ with emission peak at 450 nm which is made in the same manner as in Example 9 is used. The light emitting component is mounted in the cup provided at the tip of a silver-plated copper mount lead, by die bonding with epoxy resin. Electrodes of the light emitting component, the mount lead and the inner lead were electrically connected by wire boding with gold wires.

Phosphor is made by mixing a first fluorescent material represented by general formula $Y_3(Al_{0.5}Ga_{0.5})_5O_{12}:Ce$ capable of emitting green light and a second fluorescent material represented by general formula $(Y_{0.2}Gd_{0.8})_3Al_5O_{12}:Ce$ capable of emitting red light prepared as follows. Namely, rare earth elements of Y, Gd and Ce are solved in acid in stoichiometrical proportions, and coprecipitating the solution with oxalic acid. Oxide of the co precipitation obtained by firing it is mixed with aluminum oxide and gallium oxide, thereby to obtain respective mixture materials. The mixture is mixed with ammonium fluoride used as a flux, and fired in a crucible at a temperature of 1400° C. in air for 3 hours. Then, the fired material is ground by a ball mill in water, washed, separated, dried and sieved thereby to obtained the first and second fluorescent materials of the specified particle size distribution.

40 parts by weight of the first fluorescent material, 40 parts by weight of the second fluorescent material and 100 parts by weight of epoxy resin are sufficiently mixed to form a slurry. The slurry is poured into the cup which is provided on the mount lead wherein the light emitting component is placed. Then the resin including the phosphor is cured at 130° C. for 1 hour. Thus a coating layer including the phosphor in thickness of 120 μm is formed on the light emitting component. Concentration of the phosphor in the coating layer is increased gradually toward the light emitting component. Further, the light emitting component and the phosphor are sealed by molding with translucent epoxy resin for the purpose of protection against extraneous stress, moisture and dust. A lead frame with the coating layer of phosphor formed thereon is placed in a bullet-shaped die and mixed with translucent epoxy resin and then cured at 150° C. for 5 hours. Under visual observation of the light emitting diode formed as described above in the direction normal to the light emitting plane, it was found that the central portion was rendered yellowish color due to the body color of the phosphor.

Measurements of chromaticity point, color temperature and color rendering index of the light emitting diode of Example 10 which was made as described above gave values of (0.32, 0.34) for chromaticity point (x, y), 89.0 for color rendering index (Ra) and light emitting efficiency of 10 lm/W. Further in weatherability tests under conditions of energization with a current of 60 mA at room temperature, 20 mA at room temperature and 20 mA at 60° C. with 90% RH, no change due to the phosphor was observed, showing no difference from an ordinary blue light emitting diode in the service life characteristic.

Example 11

$In_{0.4}Ga_{0.6}N$ semiconductor having an emission peak at 470 nm is used as an LED element. Light emitting components are made by flowing TMG (trimethyl gallium) gas, TMI (trimethyl indium) gas, nitrogen gas and dopant gas together with a carrier gas on a cleaned sapphire substrate thereby to form a gallium nitride compound semiconductor layer in the MOCVD process. A gallium nitride semiconductor layer having N type conductivity and a gallium nitride semiconductor layer having P type conductivity were formed by switching $SiH_4$ and $Cp_2Mg$ used as the dopant gas, thereby forming a PN junction. For the LED element, a contact layer which is gallium nitride semiconductor having N type conductivity, a clad layer which is gallium nitride aluminum semiconductor having P type conductivity and a contact layer which is gallium nitride semiconductor having P type conductivity are formed. An activation layer of non-doped InGaN with thickness of about 3 nm is formed between the contact layer having N type conductivity and the clad layer having P type conductivity, thereby to make single quantum well structure. A buffer layer is provided on the sapphire substrate by forming a gallium nitride semiconductor layer at a low temperature.

After forming the layers and exposing the surfaces of P type and N type semiconductor layers by etching, electrodes are formed by sputtering. After scribing the semiconductor wafer which is made as described above, light emitting components are made by dividing the wafer with an external force.

The light emitting component is mounted in a cup at the tip of a silver-plated copper mount lead by die bonding with epoxy resin. Electrodes of the light emitting component, the mount lead and the inner lead are electrically connected by wire boding with gold wires having a diameter of 30 μm.

The lead frame with the light emitting component attached thereon is placed in a bullet-shaped die and sealed with translucent epoxy resin for molding, which is then cured at 150° C. for 5 hours, thereby to form a blue light emitting diode. The blue light emitting diode is connected to one end face of an acrylic optical guide plate which is polished on all end faces. On one surface and side face of the acrylic plate, screen printing is applied by using barium titanate dispersed in an acrylic binder as white color reflector, which is then cured.

Phosphor is made by mixing a fluorescent material represented by general formula $(Y_{0.8}Gd_{0.2})_3Al_5O_{12}:Ce$ capable of emitting yellow light of relatively short wavelength and a fluorescent material represented by general formula $(Y_{0.4}Gd_{0.6})_3Al_5O_{12}:Ce$ capable of emitting yellow light of relatively long wavelength prepared as follows. Namely, rare earth elements of Y, Gd and Ce are solved in acid in stoichiometrical proportions, and coprecipitating the solution with oxalic acid. Oxide of the co precipitation obtained by firing it is mixed with aluminum oxide, thereby to obtain respective mixture material. The mixture is mixed with ammonium fluoride used as a flux, and fired in a crucible at a temperature of 1400° C. in air for 3 hours. Then the fired material is ground by a ball mill in water, washed, separated, dried and sieved.

Figure 22A:
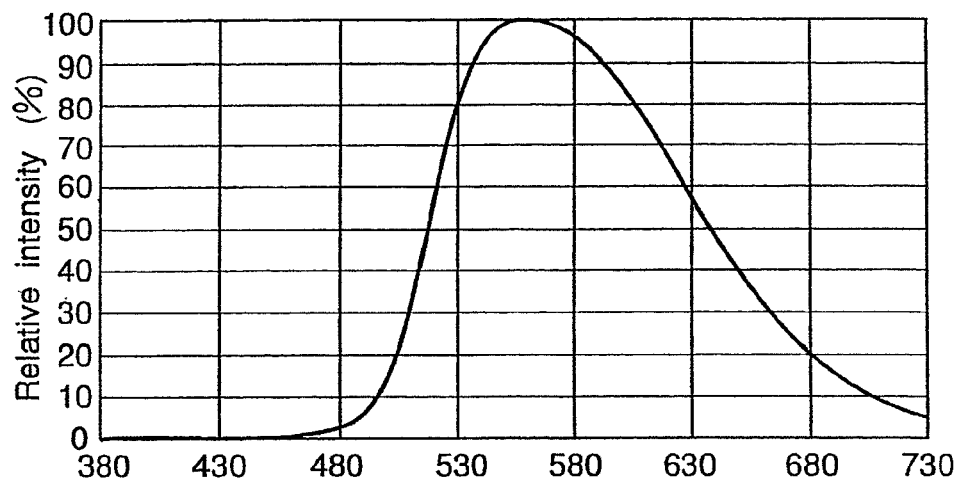
FIG. 22A shows the emission spectrum of the phosphor $(Y_{0.8}Gd_{0.2})_3Al_5O_{12}$:Ce of Example 11.
Figure 22B:
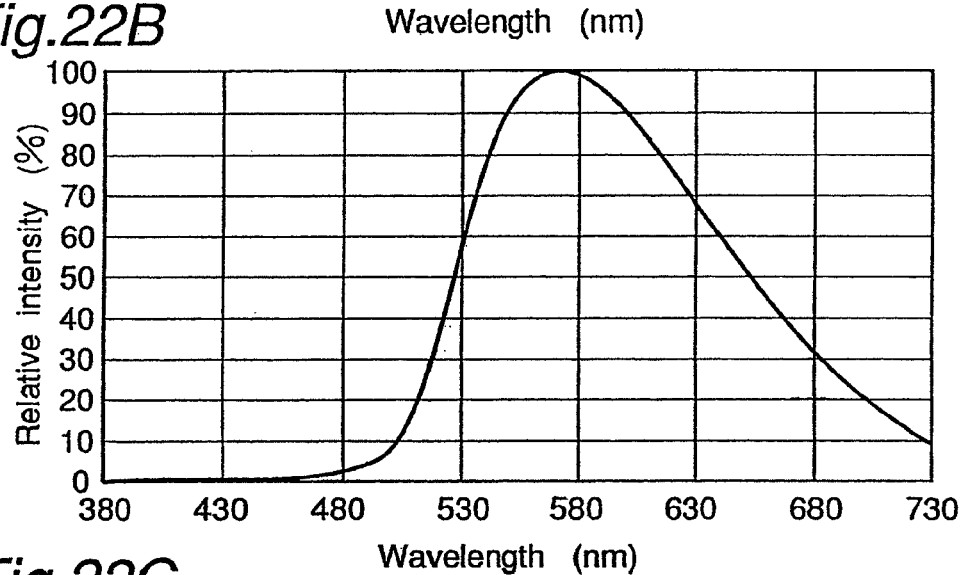
FIG. 22B shows the emission spectrum of the phosphor $(Y_{0.4}Gd_{0.6})_3Al_5O_{12}$:Ce of Example 11.
Figure 22C:
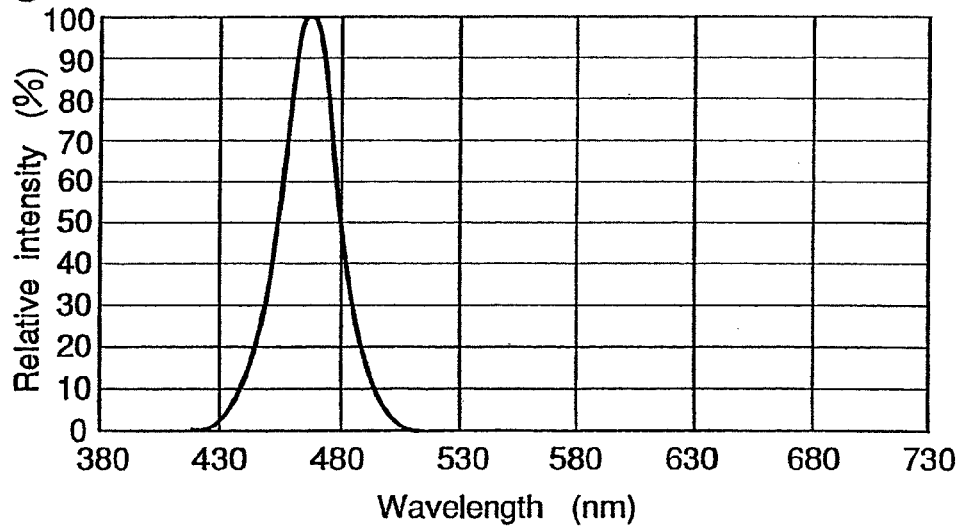
FIG. 22C shows the emission spectrum of the light emitting component of Example 11 having the emission peak wavelength of 470 nm.
Figure 23:
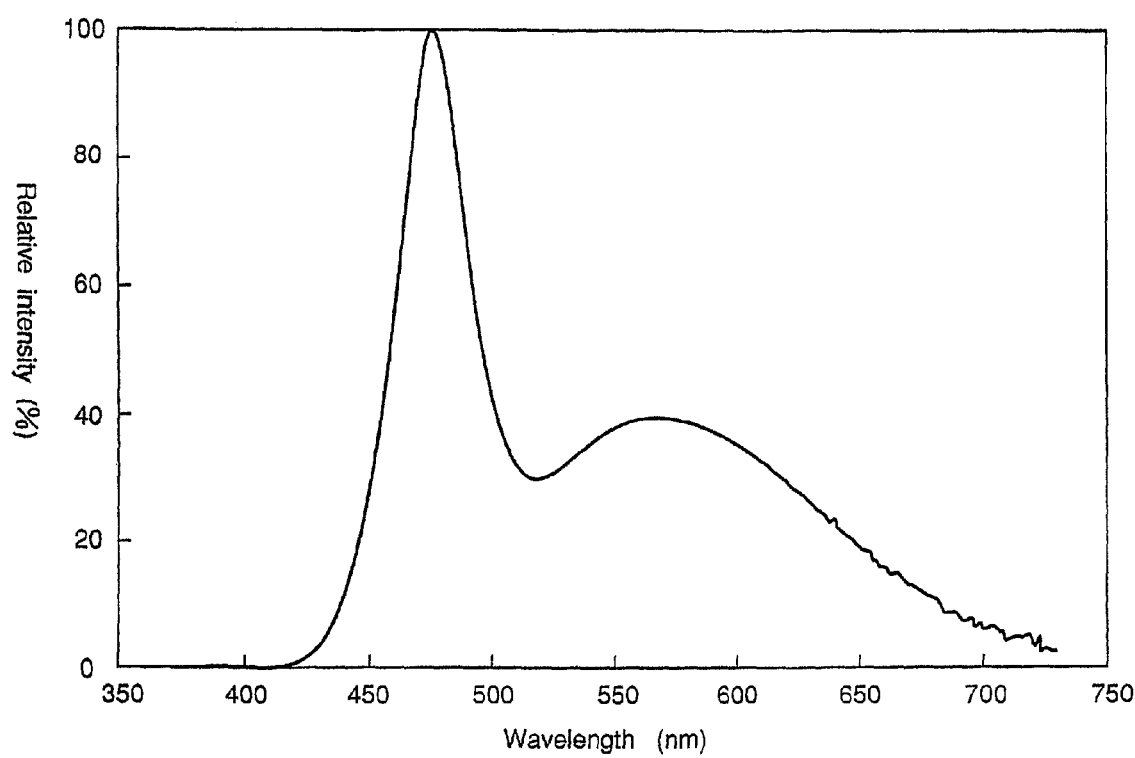
FIG. 23 shows the emission spectrum of the light emitting diode of Example 11.

100 parts by weight of yellow fluorescent material of relatively short wavelength and 100 parts by weight of yellow fluorescent material of relatively long wavelength which are made as described above are sufficiently mixed with 1000 parts by weight of acrylic resin and extruded, thereby to form a fluorescent material film to be used as color converting material of about 180 μm in thickness. The fluorescent material film is cut into the same size as the principal emission plane of the optical guide plate and arranged on the optical guide plate, thereby to make a light emitting device. Measurements of chromaticity point and color rendering index of the light emitting device of Example 3 which is made as described above gave values of (0.33, 0.34) for chromaticity point (x, y), 88.0 for color rendering index (Ra) and light emitting efficiency of 101 m/W. FIG. 22A, FIG. 22B and FIG. 22C show emission spectra of the fluorescent material represented by $(Y_{0.8}Gd_{0.2})_3Al_5O_{12}:Ce$ and a fluorescent material represented by general formula $(Y_{0.4}Gd_{0.6})_3Al_5O_{12}:Ce$ used in Example 11. FIG. 23 shows emission spectrum of the light emitting diode of Example 11. Further in life tests under conditions of energization with a current of 60 mA at room temperature, 20 mA at room temperature and 20 mA at 60° C. with 90% RH, no change due to the fluorescent material was observed. Similarly, desired chromaticity can be maintained even when the wavelength of the light emitting component is changed by changing the content of the fluorescent material.

Example 12

The light emitting diode of Example 12 was made in the same manner as in Example 1 except for using phosphor represented by general formula $Y_3In_5O_{12}:Ce$. 100 pieces of the light emitting diode of Example 12 were made. Although the light emitting diode of Example 12 showed luminance lower than that of the light emitting diodes of Example 1, showed good weatherability comparable to that of Example 1 in life test.

As described above, the light emitting diode of the present invention can emit light of a desired color and is subject to less deterioration of emission efficiency and good weatherability even when used with high luminance for a long period of time. Therefore, application of the light emitting diode is not limited to electronic appliances but can open new applications including display for automobile, aircraft and buoys for harbors and ports, as well as outdoor use such as sign and illumination for expressways.

The invention claimed is:
1. A light emitting diode comprising:
an LED chip having an electrode;
a transparent material covering said LED chip, and
a phosphor contained in said transparent material and absorbing a part of light emitted by said LED chip and emitting light of wavelength different from that of the absorbed light;
wherein the main emission peak of said LED chip is within the range from 400 nm to 530 nm, a concentration of said phosphor in the vicinity of said LED chip is larger than a concentration of said phosphor in the vicinity of the surface of said transparent material, and said phosphor diffuses the light from said LED chip and suppresses a formation of an emission pattern by a partial blocking of the light by said electrode.

2. The light emitting diode according to claim 1, wherein said LED chip comprises a sapphire substrate.

3. The light emitting diode according to claim 1, wherein said LED chip emits a light having a spectrum with a peak in the range from 420 to 490 nm, said phosphor emits light having a spectrum with a peak in the range from 510 to 600 nm and a tail continuing beyond 700 nm, and said spectrum of the light emitted from said phosphor and said spectrum of the light emitted from said LED chip overlap with each other to make a continuous combined spectrum.

4. The light emitting diode according to claim 3, wherein said spectrum of the light emitted from said phosphor has a peak in the range from 530 to 570 mm and a tail continuing beyond 700 nm.

5. The light emitting diode according to claim 3, wherein a color of said combined spectrum is white.

6. The light emitting diode according to claim 1, wherein said phosphor comprises two or more kinds of fluorescent materials.

7. The light emitting diode according to claim 1, wherein said phosphor comprises an yttrium-aluminum-garnet fluorescent material containing Y and Al.

8. The light emitting diode according to claim 1, wherein said phosphor has a crystal structure.

9. The light emitting diode according to claim 1, wherein said LED chip comprises a light emitting layer of single quantum well or multi quantum well structure.

10. The light emitting diode according to claim 1, wherein said LED chip comprises InGaN.

11. The light emitting diode according to claim 1, wherein said transparent material is selected from the group consisting of epoxy resin, urea resin, silicone resin and glass.

12. The light emitting diode according to claim 1, wherein said transparent material contains a dispersant.

13. The light emitting diode according to claim 12, wherein said dispersant is selected from the group consisting of barium titanate, titanium oxide, aluminum oxide and silicon dioxide.

14. The light emitting diode according to claim 1, wherein said transparent material contains a color agent.

* * * * *